United States Patent [19]
Rainton

[11] Patent Number: 5,724,485
[45] Date of Patent: Mar. 3, 1998

[54] ADAPTIVE CROSS CORRELATOR APPARATUS COMPRISING ADAPTIVE CONTROLLER FOR ADAPTIVELY ADJUSTING TRANSFER FUNCTIONS OF TWO FILTERS

[75] Inventor: David Rainton, Soraku-Gun, Japan

[73] Assignee: ATR Human Information Processing Research Laboratories, Kyoto, Japan

[21] Appl. No.: 533,857

[22] Filed: Sep. 26, 1995

[30] Foreign Application Priority Data

Sep. 30, 1994 [JP] Japan ................................ 6-236809

[51] Int. Cl.$^6$ ........................................... G06F 15/00
[52] U.S. Cl. ................................. 395/20; 381/71
[58] Field of Search ................ 395/20, 2.28; 381/71;
379/402, 410; 370/290; 364/724.11, 514,
162; 367/124; 375/233; 348/664, 667, 663;
455/296

[56] References Cited

U.S. PATENT DOCUMENTS

| | | | |
|---|---|---|---|
| Re. 32,580 | 1/1988 | Atal et al. ........................... | 395/2.28 |
| 4,255,791 | 3/1981 | Martin ................................ | 364/514 |
| 4,480,333 | 10/1984 | Ross .................................. | 381/71 |
| 4,669,115 | 5/1987 | Messerschmitt .................... | 379/402 |
| 4,884,229 | 11/1989 | Dekker .............................. | 364/724.11 |
| 5,206,715 | 4/1993 | Jung et al. ......................... | 348/664 |
| 5,208,786 | 5/1993 | Weinstein et al. ................. | 367/124 |
| 5,347,586 | 9/1994 | Hill et al. .......................... | 381/71 |
| 5,353,306 | 10/1994 | Yamamoto ......................... | 375/233 |
| 5,361,303 | 11/1994 | Eatwell ............................. | 381/71 |
| 5,367,342 | 11/1994 | Bang ................................. | 348/667 |
| 5,369,668 | 11/1994 | Yamamoto ......................... | 375/233 |
| 5,371,789 | 12/1994 | Hirano .............................. | 379/410 |
| 5,428,831 | 6/1995 | Monzello et al. ................. | 455/296 |
| 5,475,445 | 12/1995 | Yamaguchi et al. .............. | 348/663 |
| 5,526,347 | 6/1996 | Chen et al. ....................... | 370/290 |
| 5,568,411 | 10/1996 | Batruni ............................. | 364/724.19 |
| 5,590,205 | 12/1996 | Popovich .......................... | 381/71 |
| 5,602,926 | 2/1997 | Ohashi et al. .................... | 381/71 |
| 5,623,402 | 4/1997 | Johnson ............................ | 364/162 |

OTHER PUBLICATIONS

Alfred O. Hero et al., "A New Generalized Cross Correlator", IEEE Transactions on Acoustics, Speech, and Signal Processing, vol. ASSP-33, No. 1, Feb. 1985.

G. Clifford Carter, "Coherence and Time Delay Estimation", Proceedings of the IEEE, vol. 75, No. 2, Feb. 1987.

Mordechai Segal et al., "Estimate-Maximize Algorithms for Multichannel Time Delay and Signal Estimation", IEEE Transactions on Signal Processing, vol. 39, No. 1, Jan. 1991.

Y. Bar-Shalom et al., "Analysis of Wide-Band Cross Correlation for Time-Delay Estimation", IEEE Transactions on Signal Processing, vol. 41, No. 1, Jan. 1993.

(List continued on next page.)

Primary Examiner—Robert W. Downs
Assistant Examiner—Sanjiv Shah
Attorney, Agent, or Firm—Birch Stewart Kolasch and Birch, LLP

[57] ABSTRACT

In an adaptive cross correlator apparatus, a first receiving section receives a signal and outputs the received signal as a first signal, and a second receiving section receives a further signal and outputs the received further signal as a second signal, wherein the second receiving section is provided at a position different from that of the first receiving section. A first filter filters the first signal with a first changeable transfer function and outputs a filtered first signal, and a second filter filters the second signal with a second changeable transfer function and outputs a filtered second signal. Further, a cross correlator calculates a cross correlation value by using a predetermined cross correlation function based on the filtered first and second signals, and then, an adaptive controller calculates a discriminant function value representing a misclassification measure of the first and second signals, based on the cross correlation value and a true delay between the first and second signals, and adaptively adjusts the respective first and second transfer functions of the first and second filters so that the calculated discriminant function value becomes a minimum.

10 Claims, 18 Drawing Sheets

OTHER PUBLICATIONS

Giovanni Jacovitti et al., "Discrete Time Techniques for Time Delay Estimation", IEEE Transactions on Signal Processing, vol. 41, No. 2, Feb. 1993.

Strom et al., A reduced complexity adaptive near-far resistant receiver for DC-CDMA, IEEE global 93, pp. 1734-1738, Dec. 2, 1993.

Iltis et al., An adaptive multiuser detector with joint amplitude and delay estimation, IEEE Journal, pp. 774-785, Jun. 1994.

Malakian et al., Comparison of centralized and decentralized linear-quadratic-gaussian path control problems, IEEE proceedings, pp. 68-78, Oct. 17, 1991.

Malakian et al., Dynamic model dependency for a decentralized linear-quadratic-gaussian control problem, IEEE Proceedings, pp. 680-696, Oct. 18, 1990.

Feng et al., A new echo canceller with the estimation of flat delay, Tencon 92, pp. 1-5, Nov. 13, 1992.

ADAPTIVE CROSS CORRELATOR APPARATUS COMPRISING ADAPTIVE CONTROLLER FOR ADAPTIVELY ADJUSTING TRANSFER FUNCTIONS OF TWO FILTERS

BACKGROUND OF THE INVENTION

1. Field of the Invention

The present invention relates to an adaptive cross correlator apparatus, in particularly, to an adaptive cross correlator comprising two filters and an adaptive controller for adaptively adjusting transfer functions of the two filters.

2. Description of the Related Art

The most common method of determining the time delay between two signals $x_1(t)$ and $x_2(t)$ is to compute a cross correlation value $Rx_1x_2(\tau)$ of a cross correlation function expressed by the following Equation (1):

$$Rx_1x_2(\tau) = \frac{1}{T-\tau} \int_\tau^T x_1(t)x_2(t-\tau)dt \quad (1)$$

where the argument $\tau$ that maximizes the value of the Equation (1) provides an estimate of the delay. In order to improve this estimation, it is preferred to pre-filter the two signals $x_1(t)$ and $x_2(t)$ prior to the operation of cross correlation. This simple, but very important process is known as a generalized cross correlation (See, for example, G. Clifford Carter, "Coherence and time delay estimation", Proceedings of IEEE, Vol. 75, No. 2, pp. 236–255, in February, 1987; hereinafter, referred to as a reference document 1). The conventional generalized cross correlator apparatus implemented as a preprocessor for inputted waveforms is shown in FIG. 2.

As shown in FIG. 2, inputted signals $x_1(t)$ and $x_2(t)$ are received by, for example, finite impulse response filters (hereinafter referred to as FIR filters) 1 and 2. Then, outputted signals $y_1(t)$ and $y_2(t)$ showing filtering results are outputted from the FIR filters 1 and 2, and are inputted to a cross correlator 3. The cross correlator 3 performs a computation of cross correlation of the Equation (1) based on the inputted signals $y_1(t)$ and $y_2(t)$ so as to calculate and output a cross correlation value $Ry_1y_2(\tau)$.

The reference document 1 shows that, in the cross correlator apparatus of FIG. 2, if transfer functions $H_1(\omega)$ and $H_2(\omega)$ of the FIR filters 1 and 2 are appropriately selected, the FIR filters 1 and 2 having transfer functions $H_1(\omega)$ and $H_2(\omega)$ can be remarkably improved in the estimates of filtering time delay. The two FIR filters 1 and 2 are able to emphasize the signal passed to the cross correlator 3 at those frequencies at which the coherence therebetween or signal-to-noise ratio (SNR) is the highest. For example, it is well known to those skilled in the art how the transfer functions $H_1(\omega)$ and $H_2(\omega)$ of the FIR filters 1 and 2 should be chosen in order to achieve the time delay estimation (TDE) with minimum errors on the assumption that the two signals are Gaussian and contain Gaussian noise. Further, the reference document 1 also proposes a whole set or group of ad hoc filters.

However, this approach of the conventional method has had such a problem that errors would occur theoretically in detecting the time delay within non-Gaussian noise and estimating the signal-to-noise ratio.

SUMMARY OF THE INVENTION

An essential object of the present invention is therefore to provide an adaptive cross correlator apparatus capable of adaptively adjust transfer functions $H_1(\omega)$ and $H_2(\omega)$ of two filters so that no error occurs when detecting the time delay between two inputted signals within a non-Gaussian noise, and without giving a signal-to-noise ratio.

In order to achieve the aforementioned objective, according to one aspect of the present invention, there is provided an adaptive cross correlator apparatus comprising:

first receiving means for receiving a signal and outputting the received signal as a first signal;

second receiving means for receiving a further signal and outputting the received further signal as a second signal, said second receiving means provided at a position different from that of said first receiving means;

first filtering means for filtering the first signal outputted from said first receiving means with a first changeable transfer function and outputting a filtered first signal;

second filtering means for filtering the second signal outputted from said second receiving means with a second changeable transfer function and outputting a filtered second signal;

cross correlator means for calculating a cross correlation value by using a predetermined cross correlation function based on the filtered first signal outputted from said first filtering means and the filtered second signal outputted from said second filtering means; and adaptive control means for calculating a discriminant function value representing a misclassification measure of the first and second signals, based on the cross correlation value outputted from said cross correlator means and a true delay between the first and second signals, and for adaptively adjusting the first transfer function of said first filtering means and the second transfer function of said second filtering means so that the calculated discriminant function value becomes a minimum.

The above-mentioned adaptive cross correlator apparatus preferably further comprises:

delay calculating means for calculating a delay between the first and second signals, based on the cross correlation value outputted from said cross correlator means, after a process of adaptive control performed by said adaptive control means.

In the above-mentioned adaptive cross correlator apparatus, said adaptive cross correlator apparatus is provided for separating a first speech signal generated by a first sound source and a second speech signal generated by a second sound source, from each other, the first and second speech signals having spectral characteristics different from each other and being generated at locations different from each other, wherein said adaptive cross correlator apparatus preferably further comprises:

delay means for delaying the filtered first signal outputted from said first filtering means, by a delay amount equal to a delay between said first and second receiving means which is calculated by said delay calculation means when the first speech signal generated by the first sound source is received by said first and second receiving means, and for outputting a delayed signal; and adding means for adding up the delayed signal outputted from said delay means and the filtered second signal outputted from said second filtering means, and for outputting a signal representing the addition result, thereby outputting an improved first speech signal.

In the above-mentioned adaptive cross correlator apparatus, the discriminant function representing the misclassification measure of the first and second signals is preferably a linearly differentiable function, and wherein said adaptive control means adaptively adjusts the first transfer function of said first filtering means and the second transfer function of said second filtering means by using a gradient descent method so that said calculated discriminant function value becomes a minimum.

In the above-mentioned adaptive cross correlator apparatus, said first and second filtering means are preferably finite impulse filters; and wherein said adaptive control means adaptively adjusts a filter coefficient of the finite impulse filter of said first filtering means and a filter coefficient of the finite impulse filter of said second filtering means so that said calculated discriminant function value becomes a minimum.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments according to the present invention will be described below with reference to the attached drawings.

Figure 1:
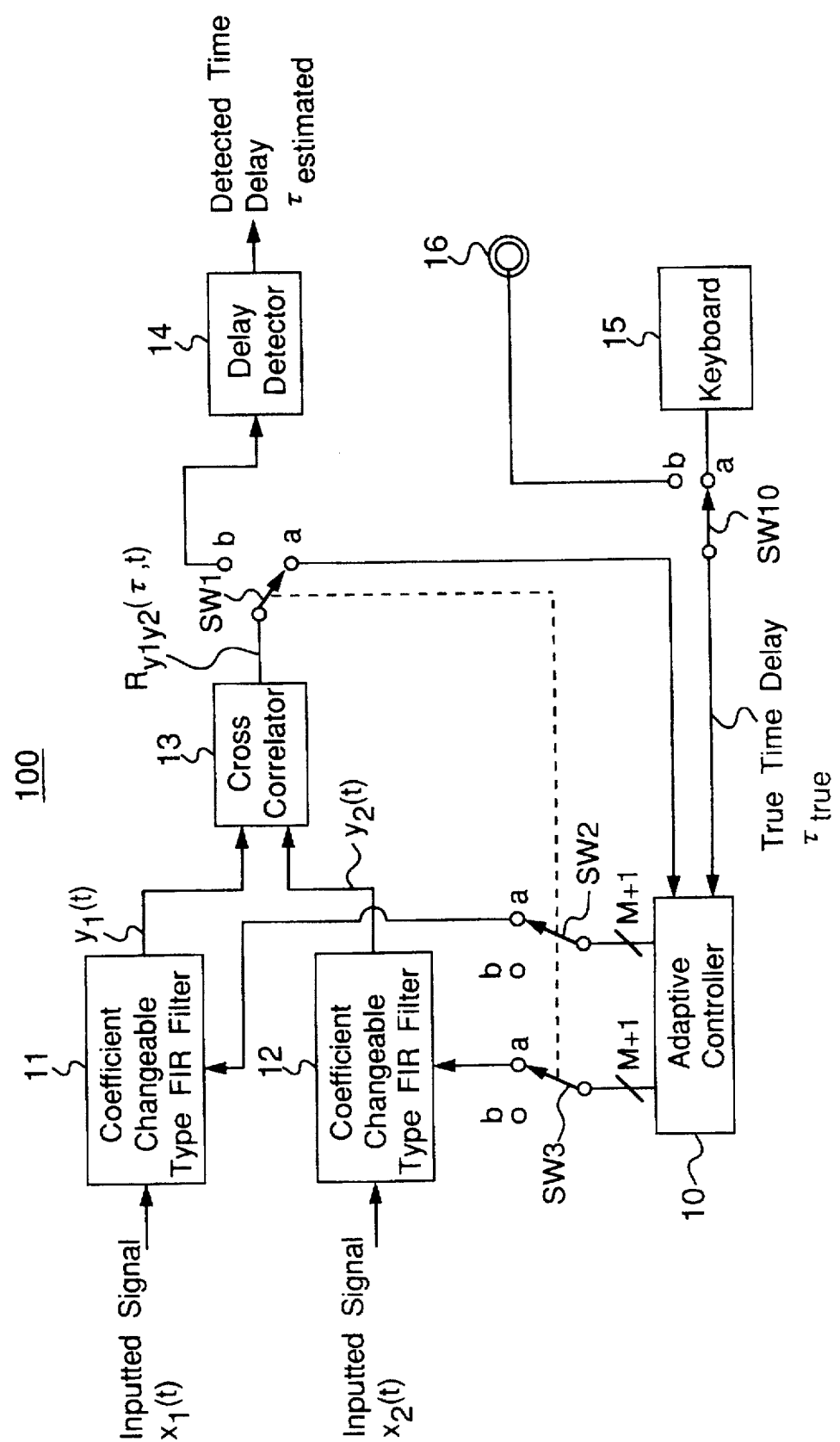
FIG. 1 is a block diagram of an adaptive cross correlator apparatus of a preferred embodiment according to the present invention.
Figure 2:
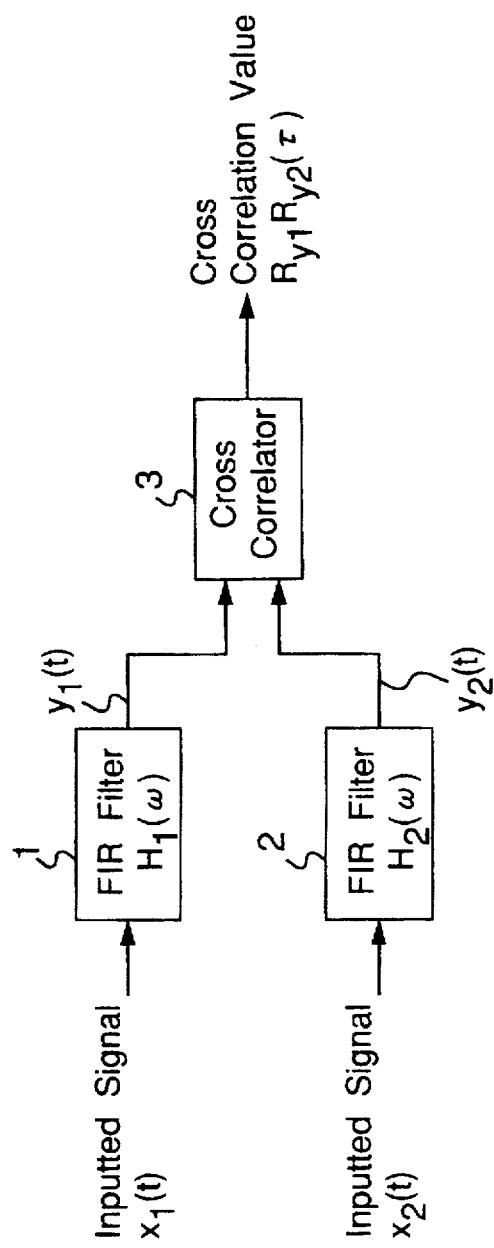
FIG. 2 is a block diagram of a cross correlator apparatus of a prior art example.

FIG. 1 is a block diagram of an adaptive cross correlator apparatus 100 of a preferred embodiment according to the present invention. The adaptive cross correlator apparatus 100 of the preferred embodiment has both of:

(a) a training mode or a learning mode in which transfer functions $H_1(\omega)$ and $H_2(\omega)$ of coefficient changeable type FIR filters 11 and 12 are adaptively adjusted based on inputted signals $x_1(t)$ and $x_2(t)$ which are generated by the same sound source and are transmitted along different propagation paths, wherein a relative delay occurs therebetween so that the two signals $x_1(t)$ and $x_2(t)$ are different from each other; and (b) a detection mode in which a delay $\tau_{estimated}$ between two inputted signals $x_1(t)$ and $x_2(t)$ is detected based on those inputted signals $x_1(t)$ and $x_2(t)$.

Referring to FIG. 1, the adaptive cross correlator apparatus 100 of the present preferred embodiment comprises:

(a) coefficient changeable type FIR filters 11 and 12 for filtering the inputted signals $x_1(t)$ and $x_2(t)$, respectively;

(b) a cross correlator 13 for computing or calculating a cross correlation value by performing a calculation of the Equation (1) based on the outputted signals $y_1(t)$ and $y_2(t)$ outputted from the FIR filters 11 and 12;

(c) an adaptive controller 10, which operates in the training mode, for adaptively adjusting the transfer functions $H_1(\omega)$ and $H_2(\omega)$ of the FIR filters 11 and 12, more specifically, for adaptively adjusting filter coefficients of the FIR filters 11 and 12 so as to set those filter coefficients to optimal values based on an outputted signal $Ry_1y_2(\tau, t)$ outputted from the cross correlator 13, so that no error occurs when detecting the time delay within a non-Gaussian noise, that is, a discriminant function value representing a misclassification measure therebetween becomes a minimum value; and (d) a delay detector 14, which operates in the detection mode, for detecting and outputting a delay $\tau_{estimated}$ between the inputted signals $x_1(t)$ and $x_2(t)$ based on the outputted signal $Ry_1y_2(\tau, t)$ outputted from the cross correlator 13.

The adaptive cross correlator apparatus 100 of the present preferred embodiment is characterized in that the apparatus 100 adaptively adjusts the transfer functions $H_1(\omega)$ and $H_2(\omega)$ of the FIR filters 11 and 12 so that an error caused in the delay estimation is minimized. Each pair of inputted signals $x_1(t)$ and $x_2(t)$ is classified by the cross correlator 13 using the delay $\tau_{estimated}$. The delay $\tau_{estimated}$ is expressed by the following Equation (2):

$$\tau_{estimated} = \underset{\tau}{\mathrm{argmax}} \, Ry_1y_2(\tau), \qquad (2)$$

where the function "argmax" with respect to $\tau$ is a function that represents a value of argument $\tau$ at which $Ry_1y_2(\tau)$ becomes a maximum. In the conventional technical field of pattern recognition, $Ry_1y_2(\tau)$ is referred to as a discriminant function for a pair of inputted signals $x_1(t)$ and $x_2(t)$. A pair of inputted signals $x_1(t)$ and $x_2(t)$ can be expressed, for example, by the following Equation (3):

$$x_1(t)=n_1(t)+s(t) \; x_2(t)=n_2(t)+s(t+\tau_{true}) \qquad (3)$$

where $n_1(t)$ and $n_2(t)$ are noise signals from noise sources, and $s(t)$ is a signal whose delay $\tau_{true}$ which we, inventors try to estimate. When the delay $\tau_{estimated}$ differs from the true delay $\tau_{true}$, namely, when $\tau_{estimated} \neq \tau_{true}$, an estimation error occurs. In the preferred embodiment according to the present invention, a degree of misclassification, namely, a misclassification measure $dx_1,x_2(H_1(\omega), H_2(\omega))$ is introduced to quantify the error in the delay estimation. The misclassification measure $dx_1,x_2(H_1(\omega), H_2(\omega))$ is so set as to be positive when $\tau_{estimated} \neq \tau_{true}$, and the misclassification measure $dx_1, x_2(H_1(\omega), H_2(\omega))$ is so set as to be negative when $\tau_{estimated}=\tau_{true}$. Although there are many possible choices of measure functions for the misclassification measure, the following Equation (4) is preferably provided as the simplest definition:

$$dx_1,x_2(H_1(\omega), H_2(\omega)) = - Ry_1y_2(\tau_{true}) + Ry_1y_2(\tau_{max}) \qquad (4)$$

$$\tau_{max} = \underset{\tau \neq \tau_{true}}{\mathrm{argmax}} \, Ry_1y_2(\tau)$$

The function "argmax" in the right side of the second equation of the Equation (4) is a value of argument $\tau$ at which the discriminant function value $Ry_1y_2(\tau)$ becomes a maximum when $\tau \neq \tau_{true}$, and is a function that represents a maximum $\tau_{max}$ of the argument $\tau$. In order to minimize the number of estimation errors, the respective transfer functions $H_1(\omega)$ and $H_2(\omega)$ of the FIR filters 11 and 12 are adjusted so as to minimize the misclassification measure $dx_1,x_2(H_1(\omega), H_2(\omega))$. This adjustment can be achieved by the gradient descent method in the present preferred embodiment, although any suitable optimization technique such as a simulated annealing could be used theoretically. The cross correlation value is typically expressed in a general form of the cross correlation function, which changes in real time and is a function of time, as shown by the following Equation (5):

$$Ry_1y_2(\tau,t) = \int_\tau^t y_1(t')y_2(t'-\tau)w(t-t')dt' \qquad (5)$$

where $w(.)$ is a window function that has previously been suitably chosen. For example, one possible, preferable choice for the window function $w(.)$ is an exponential function expressed by the following Equation (6):

$$w(t)=e^{-(t/T_c)}, \; t \geq 0 \; w(t)=0, \; t<0 \qquad (6)$$

where $T_c$ is a predetermined window time constant and $Tc>0$. One simple way of applying such an exponentially decaying window function as shown in the Equation (6) to a discriminant function can be expressed by the following Equation (7):

$$Ry_1y_2(\tau, t)=(1-\alpha)Ry_1y_2(\tau, t-1)+\alpha y_1(t)y_2(t-\tau), \; 0 \leq \alpha \leq 1 \qquad (7)$$

where $\alpha$ is a forgetting factor, which is directly proportional to the inverse of the window time constant $Tc$. The time-varying equivalent of the misclassification measure defined in the Equation (4) is expressed by the following Equation (8):

$$dx_1,x_2(H_{t-1,1}(\omega), H_{t-1,2}(\omega)) = - Ry_1y_2(\tau_{true},t) + Ry_1y_2(\tau_{max},t) \qquad (8)$$

$$\tau_{max} = \underset{\tau \neq \tau_{true}}{\mathrm{argmax}} \, Ry_1y_2(\tau,t)$$

where "argmax" in the right side of the second equation of the Equation (8) is a value of argument $\tau$ at which the discriminant function value $Ry_1y_2(\tau, t)$ becomes a maximum when $\tau \neq \tau_{true}$, and is a function that represents the maximum $\tau_{max}$ of the argument $\tau$. The transfer functions $H_{t-1,1}(\omega)$ and $H_{t-1,2}(\omega)$ of the filters 11 and 12 in the Equation (8) are updated at each time "t" using the gradient descent method expressed by the following Equation (9), respectively:

$$H_{t,j}(\omega) = H_{t-1,j}(\omega) - \eta\{(\partial dx_1,x_2(H_{t-1,1}(\omega),H_{t-1,2}(\omega))/\partial H_{t-1,j}(\omega)\}, \qquad (9)$$
$$j = 1,2$$

where the case of $j=1$ applies to the FIR filter 11, the case of $j=2$ applies to the FIR filter 12, and $\eta$ is a training constant that has previously been suitably chosen. In the present preferred embodiment, it is an essential requirement that the misclassification measure $dx_1,x_2(H_{t-1,1}(\omega), H_{t-1,2}(\omega))$ can be linearly partially differentiated with the transfer function $H_{t-1,j}(\omega)$, and the only assumptions made concerning the signal and noise statistics are:

(a) the inputted signals $x_1(t)$ and $x_2(t)$ as well as noise inputted along with the inputted signals $x_1(t)$ and $x_2(t)$ are long term stationary over a time period of the training and detection modes; and (b) the inputted signals $x_1(t)$ and $x_2(t)$ as well as a noise signal inputted along with the inputted signals arrive from different spatial locations as seen from the input end of the adaptive cross correlator apparatus 100.

It is noted that the adaptive cross correlator apparatus 100 of the present preferred embodiment is unable to separate a signal and a noise which have been arrived from the same spatial location. Unlike the conventional generalized cross correlator apparatus, neither the evaluation of error-prone coherence nor the computation of error-prone signal-tonoise ratio is required in the preferred embodiment of the present invention. Indeed no knowledge of either the signal or noise power spectra is required. The transfer functions of the two FIR filters 11 and 12, or the filter coefficients thereof will simply be adjusted until the transfer functions thereof become the cross correlation function peaks at the true delay. This idea, although embarrassingly simple, is quite effective and useful.

Figure 3:
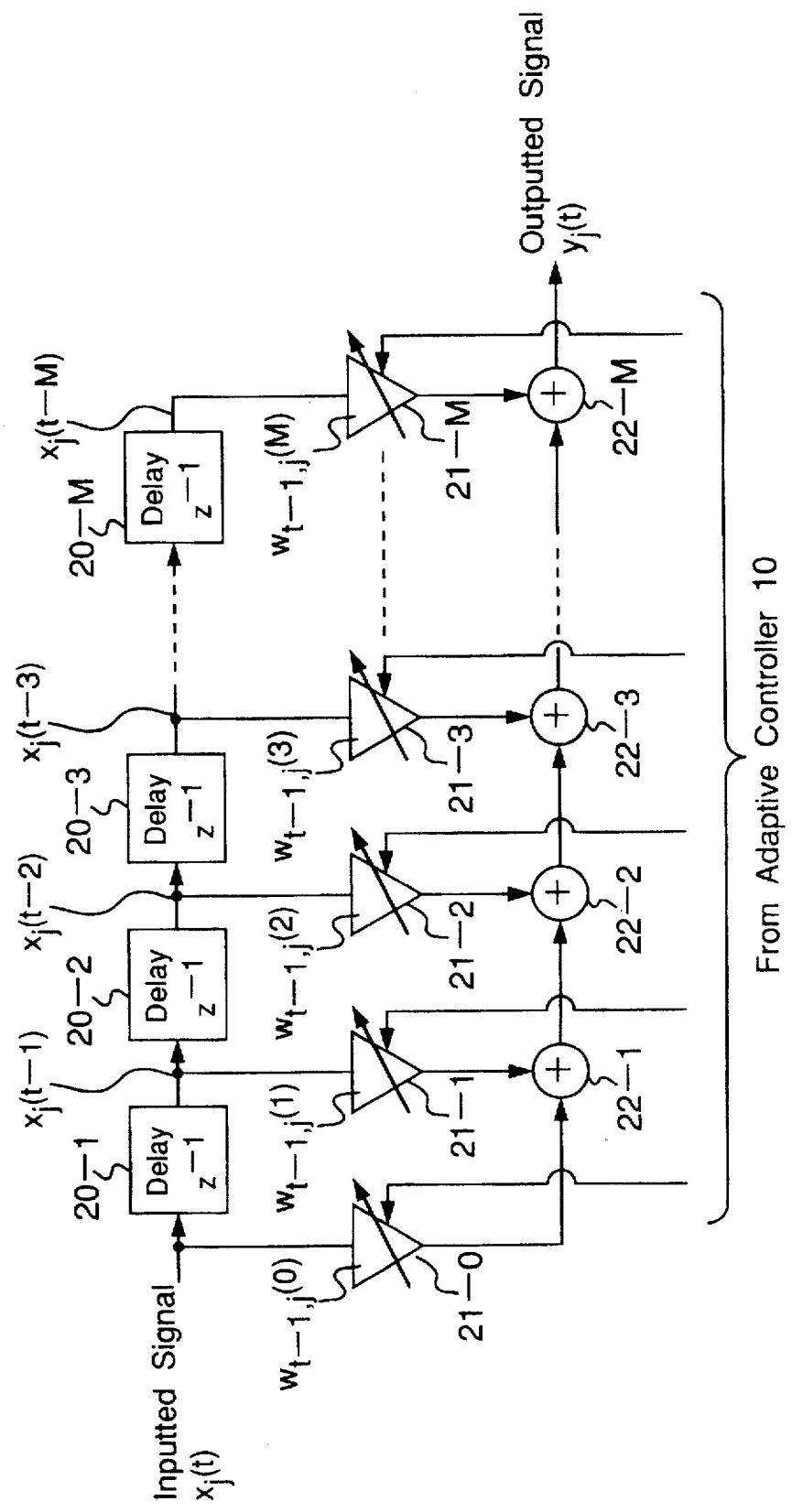
FIG. 3 is a block diagram of coefficient changeable type FIR filters 11 and 12 shown in FIG. 1.

FIG. 3 is a block diagram showing a detailed arrangement of the coefficient changeable type FIR filters 11 and 12 shown in FIG. 1. The coefficient changeable type FIR filters 11 and 12 are characterized by time-varying filter coefficient vectors, $\vec{w}_{t,1}$ and $\vec{w}_{t,2}$, respectively.

As shown in FIG. 3, the FIR filters 11 and 12 are so-called acyclic digital filters, and moreover transversal digital filters having a plurality of (M+1) filter coefficients. Each of the FIR filters 11 and 12 comprises:

a plurality of M delay circuits 20-1 to 20-M connected in cascade with one another;

a plurality of (M+1) amplification degree changeable type amplifiers 21-0 to 21-M respectively having amplification degrees $w_{t-1,j}(0)$ to $w_{t-1,j}(M)$, each of which can be changed by the adaptive controller 10; and a plurality of M adders 22-1 to 22-M connected in cascade with one another.

In this arrangement, the amplification degrees $w_{t-1,j}(0)$ to $w_{t-1,j}(M)$ respectively become filter coefficients of the FIR filters 11 and 12. In FIG. 3, j=1, 2, and FIG. 3 shows the transfer function $H_j(\omega)$ of the FIR filters 11 and 12 at a time "t". That is, FIG. 3 shows a case of the FIR filter 11 when j=1, and shows a case of the FIR filter 12 when j=2.

An inputted signal $x_j(t)$ is inputted to the adder 22-1 via the amplifier 21-0, and is also inputted to the amplifier 21-M via a plurality of M delay circuits 20-1 to 20-M each having a predetermined same delay amount, wherein a plurality of M delay circuits 20-1 to 20-M is connected in cascade with one another. A signal $x_j(t-1)$ outputted by the delay circuit 20-1 is inputted to the adder 22-1 via the amplifier 21-1. The adder 22-1 adds up the inputted two signals, and then outputs a signal representing the addition result to the adder 22-2. Further, a signal $x_j(t-2)$ outputted by the delay circuit 20-2 is inputted to the adder 22-2 via the amplifier 21-2. The adder 22-2 adds up the inputted two signals, and then outputs a signal representing the addition result to the adder 22-3. Further, a signal $x_j(t-3)$ outputted from the delay circuit 20-3 is inputted to the adder 22-3 via the amplifier 21-3. The adder 22-3 adds up the inputted two signals, and then outputs a signal representing the addition result to the adder 22-4. The following circuit of the FIR filters 11 and 12 are constituted so as to operate in a manner similar to those as described above. Thus, a signal $x_j(t-M)$ outputted by the delay circuit 20-M is inputted to the adder 22-M via the amplifier 21-M. The adder 22-M adds up the inputted two signals, and then outputs a signal representing the addition result as an outputted signal $y_j(t)$ which is the filtering result.

The misclassification measure $dx_1,x_2(H_{t-1,1}(\omega), H_{t-1,2}(\omega))$ in the Equation (8), for application to the FIR filters 11 and 12 shown in FIG. 3, can be expressed with the filter coefficient vectors $\vec{w}_{t-1,1}$ and $\vec{w}_{t-1,2}$ at a time "t-1" by the following Equation (10):

$$dx_1,x_2(\vec{w}_{t-1,1}, \vec{w}_{t-1,2}) = -Ry_1y_2(\tau_{true}, t) + Ry_1y_2(\tau_{max}, t) \quad (10)$$

where $$\tau_{max} = \underset{\tau \neq \tau_{true}}{\mathrm{argmax}}\ Ry_1y_2(\tau,t)\ , \quad (11)$$

$$Ry_1y_2(\tau,t) = (1-\alpha)Ry_1y_2(\tau,t-1) + \alpha y_1(t)y_2(t-\tau),\ 0 \leq \alpha \leq 1 \quad (12)$$

$$y_j(t) = \sum_{i=0}^{M} x_j(t-i)w_{t-1,j}(i), j=1,2 \quad (13)$$

$$\vec{w}_{t,j} = [w_{t,j}(0), w_{t,j}(1), \ldots, w_{t,j}(M)], j=1, 2 \quad (14)$$

The function "argmax" in the right side of the Equation (11) is a value of argument $\tau$ at which the discriminant function value $Ry_1y_2(\tau, t)$ becomes a maximum when $\tau \neq \tau_{true}$, and is a function that represents the maximum $\tau_{max}$ of the argument $\tau$. At a time "t+1", the j-th FIR filter 11 or 12 has a plurality of (M+1) filter coefficients $w_{t,j}(i)$. The filter coefficients $w_{t,j}(i)$ (i=0, 1, 2, ..., M) of the FIR filters 11 and 12 are updated by the adaptive controller 10 at each new inputted sample according to the following Equation (15):

$$w_{t,j}(i) = w_{t-1,j}(i) - \eta\{(\delta dx_1,x_2(\vec{w}_{t-1,1}, \vec{w}_{t-1,2})/\delta w_{t-1,j}(i)\}, \quad (15)$$

$$j = 1,2;$$

$$i = 0,1,2, \ldots, M$$

In the Equation (15), δ in the right side thereof denotes a small displacement of the subsequent quantity thereof.

The constitution and operation of the adaptive cross correlator apparatus 100 shown in FIG. 1 made up by using the above-described principle will be described below.

Referring to FIG. 1, the inputted signals $x_1(t)$ and $x_2(t)$ are received by the coefficient changeable type FIR filters 11 and 12, respectively, wherein the FIR filters 11 and 12 are constructed as shown in FIG. 3. The FIR filter 11, whose the transfer function or the filter coefficient is set through such adaptive control in the training mode by the adaptive controller 10 that the discriminant function value representing the misclassification measure becomes a minimum, filters the inputted signal $x_1(t)$ with the set transfer function $H_1(\omega)$, and then outputs an outputted filtered signal $y_1(t)$ to the cross correlator 13. On the other hand, the FIR filter 12 whose the transfer function or the coefficient is set through such adaptive control in the training mode by the adaptive controller 10 that the discriminant function value representing the misclassification measure becomes a minimum, filters the inputted signal $x_2(t)$ with the set transfer function $H_2(\omega)$, and then outputs an outputted filtered signal $y_2(t)$ to the cross correlator 13. It is to be noted that the initial transfer functions or the initial filter coefficients (or amplification degrees) of the FIR filters 11 and 12 are previously determined appropriately. The cross correlator 13 calculates the cross correlation value $Ry_1y_2(\tau, t)$ using, for example, the Equation (7), and then, outputs a signal representing the calculation result thereof to the adaptive controller 10 via a contact "a" of a switch SW1, and moreover outputs the signal representing the calculation result thereof to the delay detector 14 via a contact "b" of the switch SW1.

The true delay $\tau_{true}$ between the inputted signals $x_1(t)$ and $x_2(t)$ required in the training mode is inputted using a keyboard 15, and then, the true delay $\tau_{true}$ is inputted from the keyboard 15 to the adaptive controller 10 via the contact "a" of the switch SW10, or from an external apparatus to the adaptive controller 10 via an input terminal 16 and the contact "b" of the switch SW10. The adaptive controller 10, which operates in the training mode, calculates and updates the filter coefficients $w_{t,j}(i)$ of the FIR filters 11 and 12 using the Equation (15) based on the inputted cross correlation value $Ry_1y_2(\tau, t)$ and the true delay $\tau_{true}$ so that the discriminant function value representing the misclassification measure becomes a minimum, and then, outputs the filter coefficients $w_{t,1}(i)$ of the FIR filter 11 to the FIR filter 11 via the contact "a" of the switch SW2, then the filter coefficients $w_{t,1}(i)$ are set and updated as the amplification degrees of the amplifiers 21-0 to 21-M as shown in FIG. 3. The adaptive controller 10 also outputs the filter coefficients $w_{t,2}(i)$ of the FIR filter 12 to the FIR filter 12 via the contact "a" of a switch SW3, then the filter coefficients $w_{t,2}(i)$ are set and updated as the amplification degrees of the amplifiers 21-0 to 21-M as shown in FIG. 3. In this case, each of the switches SW1, SW2 and SW10 are switched to the contact "a" side thereof for the training mode, while they are switched to the contact "b" side thereof for the detection mode. Further, the delay detector 14, which operates in the detection mode, calculates the delay $\tau_{max}$ by using the Equation (11) based on the inputted cross correlation value $Ry_1y_2(\tau, t)$, and then outputs the calculation result thereof as a detected delay $\tau_{estimated}$.

In addition, the FIR filters 11 and 12, the cross correlator 13, the adaptive controller 10 and the delay detector 14 of the adaptive cross correlator apparatus 100 are constituted by, for example, electrical digital computers.

Next, a first application example for delay detection by using the adaptive cross correlator apparatus 100 of the present preferred embodiment is described with reference to FIGS. 4 and 5.

Figure 4:
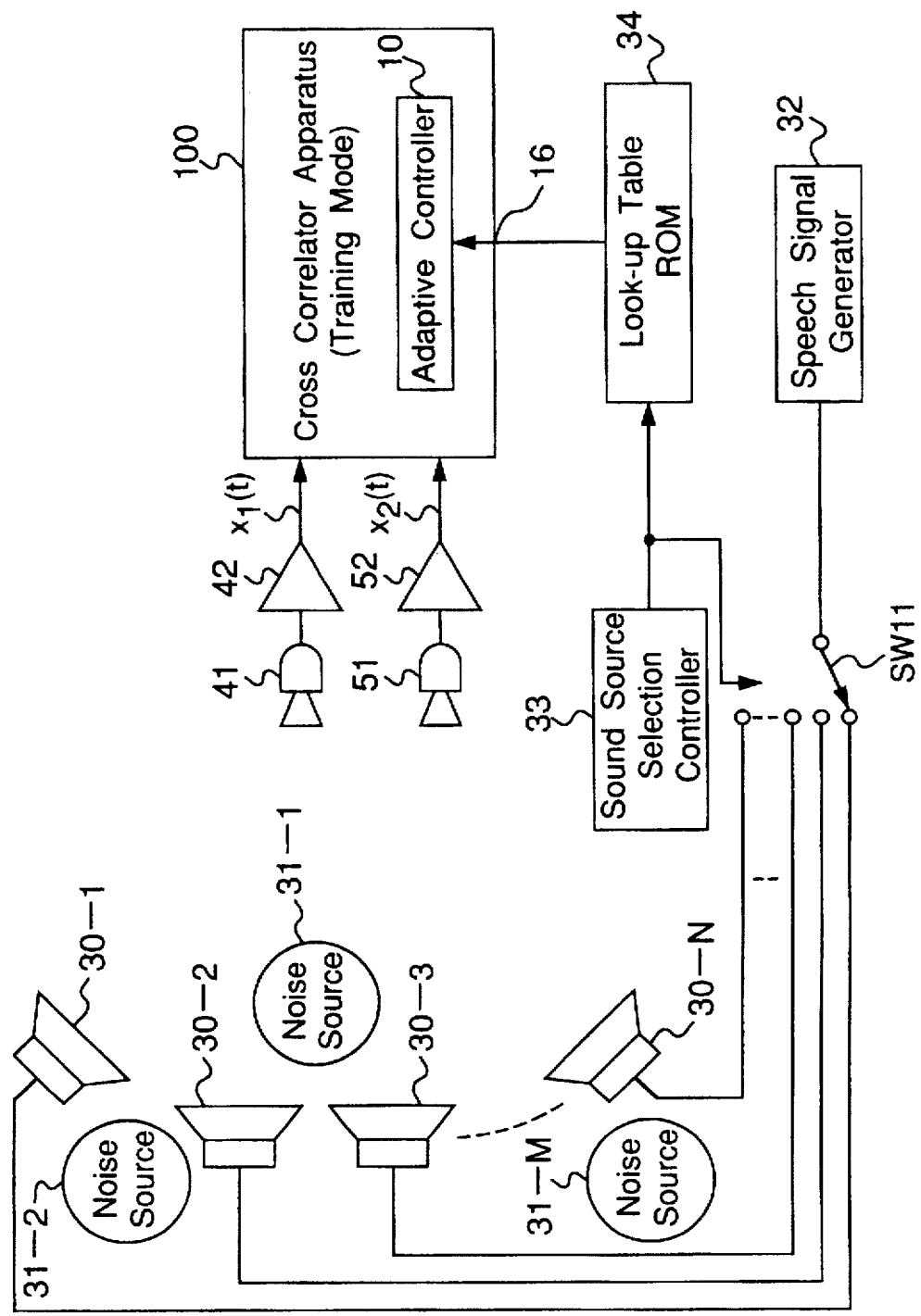
FIG. 4 is a block diagram showing an application example of the adaptive cross correlator apparatus shown in FIG. 1 in a training mode.
Figure 5:
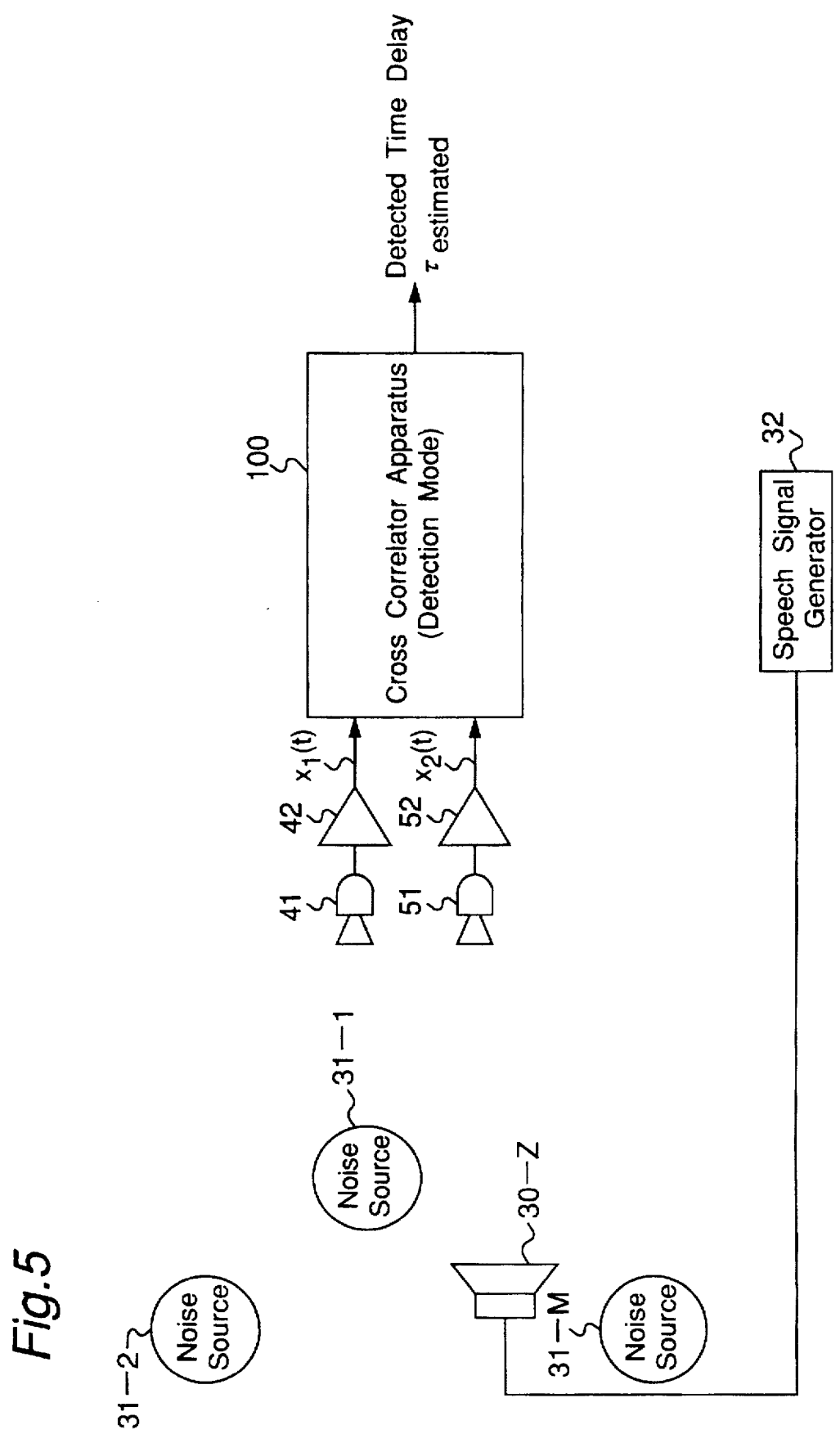
FIG. 5 is a block diagram showing an application example of the adaptive cross correlator apparatus shown in FIG. 1 in a detection mode.

Referring to FIG. 4, the adaptive cross correlator apparatus 100 comprises two microphones 41 and 51 which serve as speech signal receiving means and are located a predetermined distance away from each other, and two amplifiers 42 and 52. A signal inputted to the microphone 41 is inputted to the adaptive cross correlator apparatus 100 via the amplifier 42 as an inputted signal $x_1(t)$. On the other hand, a signal inputted to the microphone 51 is inputted to the adaptive cross correlator apparatus 100 via the amplifier 52 as an inputted signal $x_2(t)$. Further, a plurality of N loudspeakers 30-1 to 30-N are provided at known predetermined locations away from the microphones 41 and 51 on a side opposed to the microphones 41 and 51, while a plurality of M non-Gaussian noise sources 31-1 and 31-M each of which generates a non-Gaussian noise signal are provided in positions having a random relationship. A speech signal generator 32 generates a speech signal having a predetermined audio frequency, and then outputs the speech signal selectively to any one of the loudspeakers 30-1 to 30-N via a switch SW11, so that the speech signal is generated and outputted from one of the loudspeakers 30-1 to 30-N toward the microphones 41 and 51. A look-up table ROM 34 stores a true delay $\tau_{true}$ between two speech signals when the two signals are generated by any one of the loudspeakers 30-1 to 30-N and have arrived at the microphones 41 and 51. In the preferred embodiment, the true delays $\tau_{true}$ are previously measured and are stored in the look-up table ROM 34 in correspondence to the respective loudspeakers 30-1 to 30-N. A sound source selection controller 33 switches over the switch SW11 sequentially and selectively in a predetermined period so that speech signal outputted from the speech signal generator 32 are outputted to one of the respective loudspeakers 30-1 to 30-N sequentially and selectively. The sound source selection controller 33 also outputs address data to the look-up table ROM 34 so that the true delays $\tau_{true}$ corresponding to the respective loudspeakers 30-1 to 30-N are sequentially inputted from the look-up table ROM 34 to the adaptive controller 10 via the input terminal 16. It is noted that the speech signals outputted from all the loudspeakers 30-1 to 30-N are those having the same spectral characteristics.

In the training mode of the first application example of the preferred embodiment, the adaptive cross correlator apparatus 100 is set to the training mode, and the switches SW1, SW2 and SW3 are switched over to the contact "a" side thereof. Further, the transfer functions $H_1(\omega)$ and $H_2(\omega)$ of the FIR filters 11 and 12 are appropriately initialized, and are determined randomly or heuristically so as to set predetermined ones. In the training mode, two signals are generated from known locations. It is necessary that the locations of all the loudspeakers 30-1 to 30-N used in the training mode and true delays $\tau_{true}$ corresponding to the locations of these loudspeakers 30-1 to 30-N are previously known. The sound source selection controller 33 switches the switch SW11 sequentially and selectively in a predetermined period so that speech signals outputted from the speech signal generator 32 are outputted sequentially and selectively to the loudspeakers 30-1 to 30-N, while the true delays $\tau_{true}$ corresponding to the loudspeakers 30-1 to 30-N are inputted from the look-up table ROM 34 to the adaptive controller 10 via the input terminal 16. Thus, the process of the training of the adaptive cross correlator apparatus 100 is performed and the adaptive controller 10 of the adaptive cross correlator apparatus 100 slowly performs the adaptive control until the transfer functions $H_1(\omega)$ and $H_2(\omega)$ of the FIR filters 11 and 12 or the filter coefficients which are the amplification degrees of the amplifiers 21-0 to 21-M shown in FIG. 3, are updated and have been finally converged, or until the discriminant function drops below a predetermined threshold value, so that the discriminant function representing the misclassification measure is minimized. Then, when the adaptive control is completed, the respective transfer functions $H_1(\omega)$ and $H_2(\omega)$ of the two FIR filters 11 and 12 are fixed and set.

In the subsequent detection mode, the switches SW1, SW2 and SW3 of the adaptive cross correlator apparatus 100 are switched over to the contact "b" side thereof. Further, low-frequency signals such as speech signals each having the same spectral characteristic as those used in the training mode are generated from the same range of locations of the loudspeakers 30-1 to 30-N, wherein the positions of the loudspeakers 30-1 to 30-N are estimated by using the adaptive cross correlator apparatus 100. More specifically, as shown in FIG. 5, the adaptive cross correlator apparatus 100 is set to the detection mode while noise sources 31-1 to 31-M are placed still as they are. In this state, for example, a loudspeaker 30-Z is placed at the same location as that of the loudspeaker 30-3, and then, a speech signal is generated by the loudspeaker 30-Z by using the speech signal generator 32 which generates the same speech signal as that of the training mode, then the adaptive cross correlator apparatus 100 detects and outputs a delay $\tau_{estimated}$. By comparing the detected delay $\tau_{estimated}$ with the true delay $\tau_{true}$, the position of the loudspeaker 30-Z can be detected.

Further, a second application example for sound source separation using the adaptive cross correlator apparatus 100 of the present preferred embodiment is described with reference to FIG. 6. This second application example is directed to such a case that, for example, there are two persons in a room, and both persons are speaking at the same time or we wish to listen to any one person.

Figure 6:
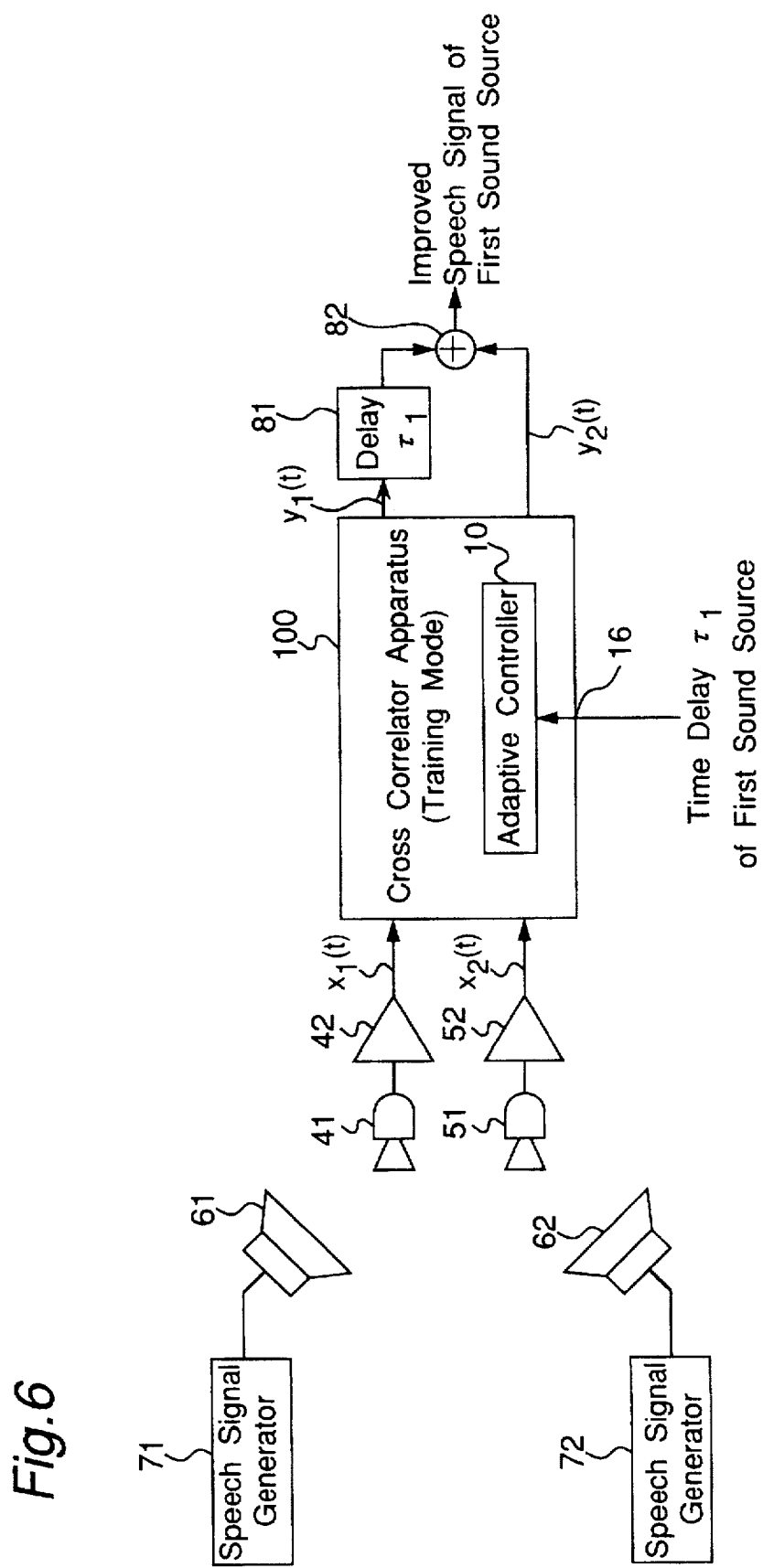
FIG. 6 is a block diagram showing an arrangement for implementing sound source separation by using the adaptive cross correlator apparatus shown in FIG. 1.

As shown in FIG. 6, the adaptive cross correlator apparatus 100 comprises two microphones 41 and 51 located a predetermined distance away from each other, and two amplifiers 42 and 52, in a manner similar to that of the first application example. Further, two loudspeakers 61 and 62 are provided at predetermined locations on a side opposed to the microphones 41 and 51, wherein the loudspeaker 61 is located at a known position. Speech signal generators 71 and 72 generate speech signals of predetermined audio frequencies having different spectral characteristics from each other, respectively, and respectively output and generate the speech signals to the loudspeakers 61 and 62 toward the two microphones 41 and 42. It is noted that the sound sources of sound generation by the loudspeakers 61 and 62 are hereinafter referred to as a first sound source and a second sound source, respectively. Further, a filtered signal $y_1(t)$ outputted from the FIR filter 11 of the adaptive cross correlator apparatus 100 is inputted to an adder 82 via a delay circuit 81, while a filtered signal $y_2(t)$ outputted from the FIR filter 12 is inputted directly to the adder 82 directly as it is. The adder 82 adds up the two inputted signals, and then, outputs a signal representing the addition result.

The adaptive cross correlator apparatus 100, which is set to the training mode, previously measures a delay $\tau_1$ between the inputted signals $x_1(t)$ and $x_2(t)$ with respect to a speech signal of the first sound source generated by the loudspeaker 61, and the measured delay $\tau_1$ is set to the adaptive controller 10 as a true delay $\tau_{true}$. At the same time, a delay of the delay circuit 81 is inputted to the adaptive controller 10 via the input terminal 16 as the delay $\tau_1$ of the speech signal of the first sound source. Then, the adaptive cross correlator apparatus 100 is made to operate in the training mode, then the adder 82 adds up the signal $y_1(t+1)$ and the signal $y_2(t)$. As a result, the speech signal of the first sound source outputted from the loudspeaker 61 is combined or synthesized in phase. Thus, a speech signal in which the speech signal of the first sound source is dominant can be obtained.

Figure 7:
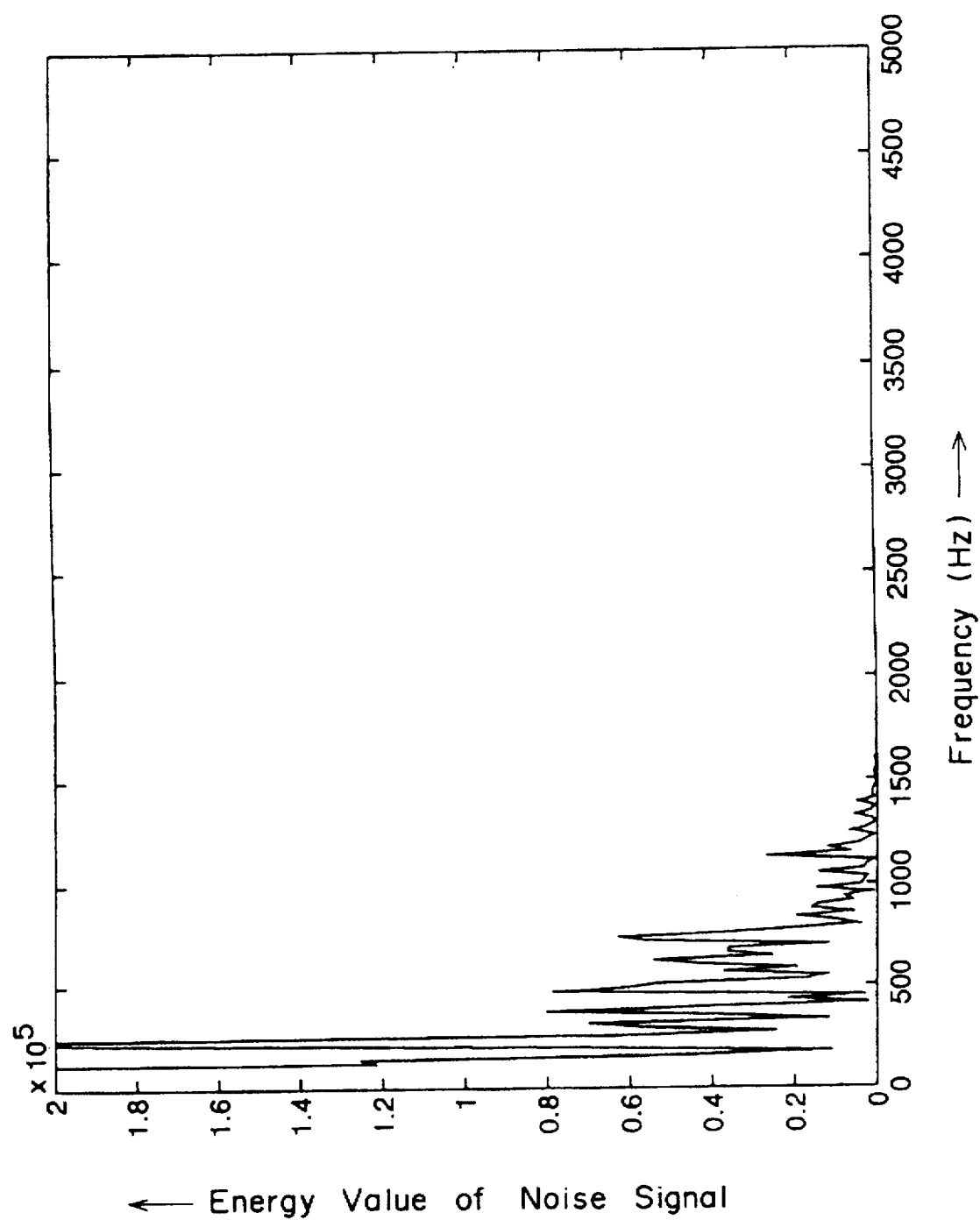
FIG. 7 is a graph showing a spectrum of a noise power used in a simulation of the adaptive cross correlator apparatus shown in FIG. 1.
Figure 8:
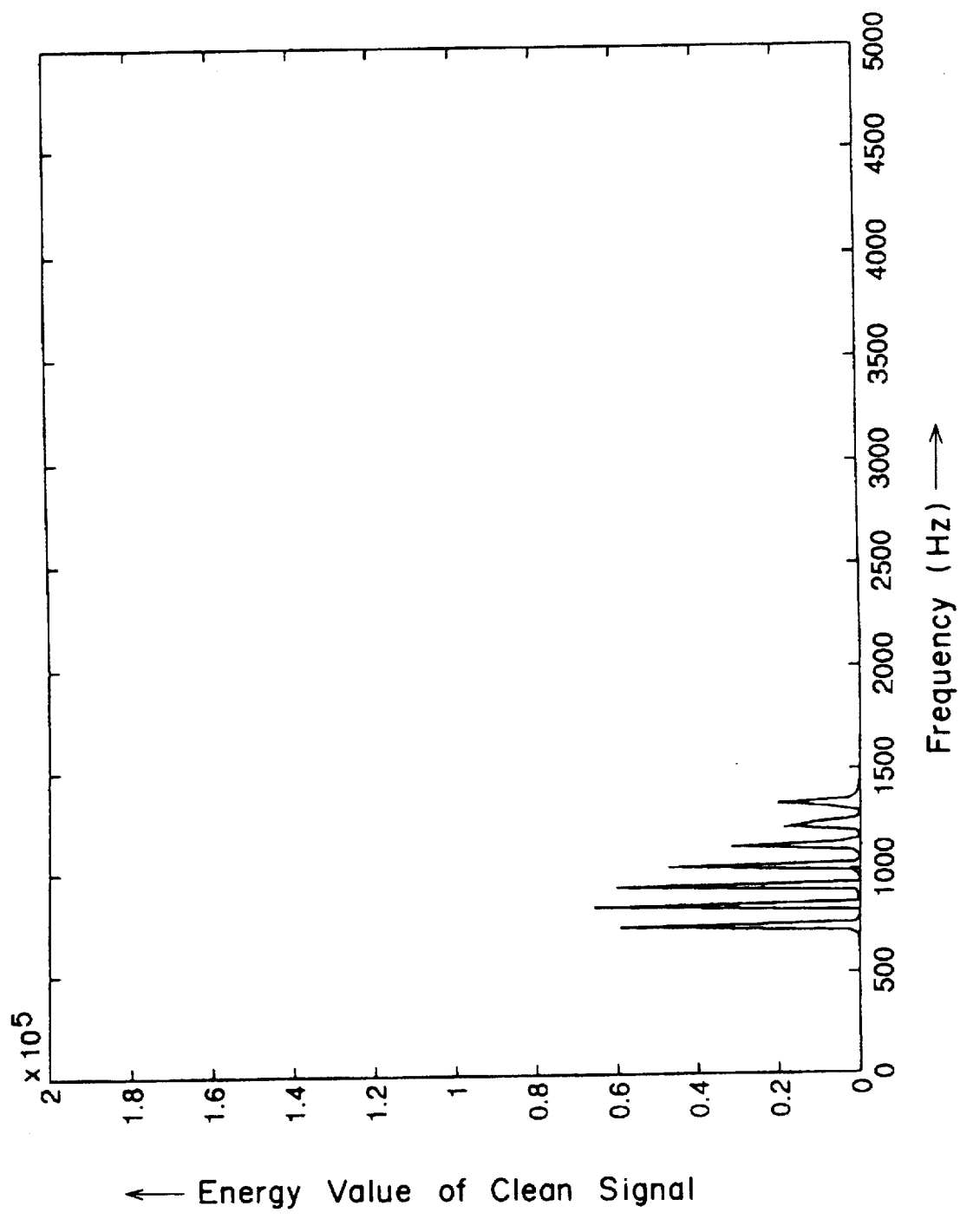
FIG. 8 is a graph showing a spectrum of a noise-free clean signal power used in the simulation of the adaptive cross correlator apparatus shown in FIG. 1.
Figure 9:
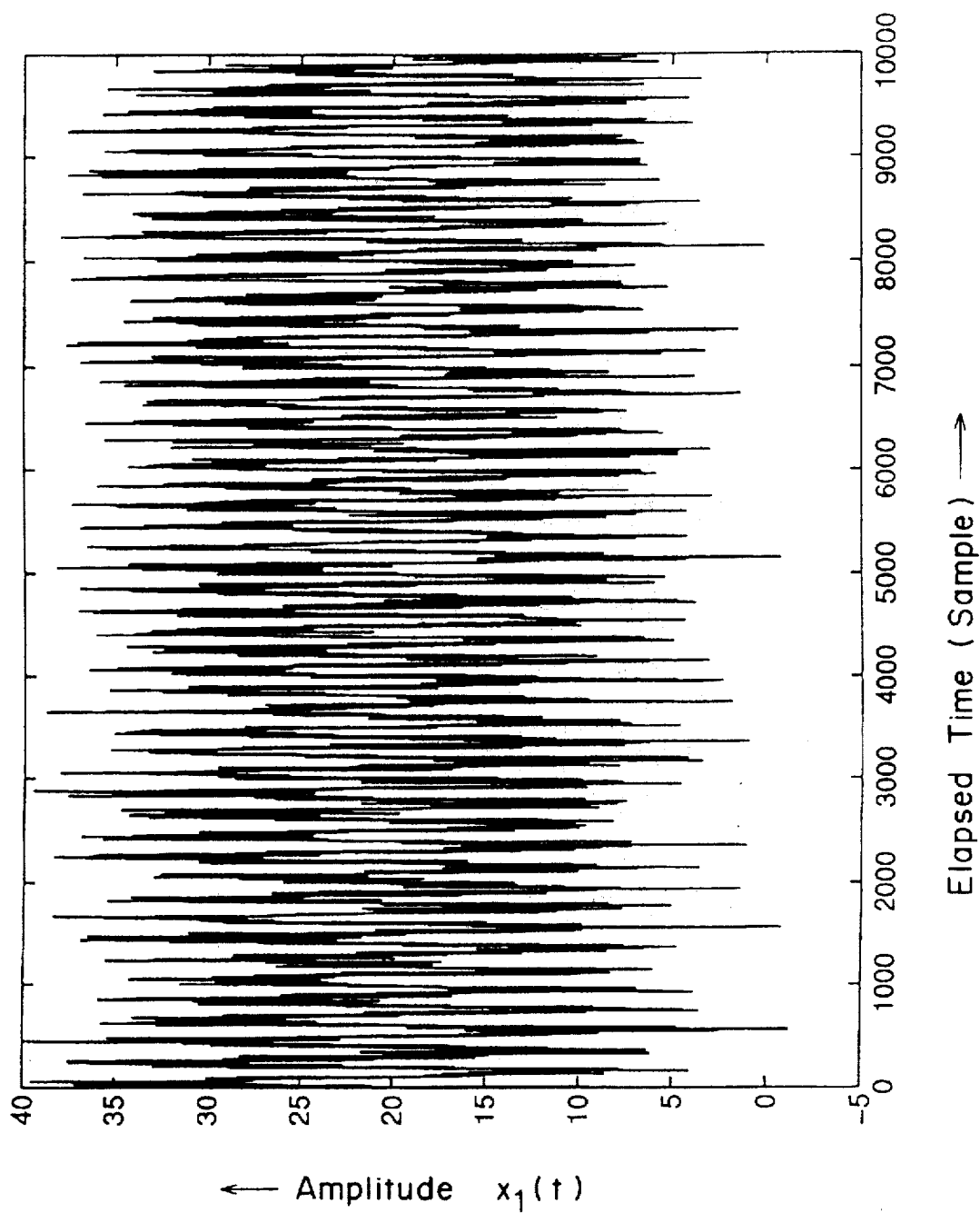
FIG. 9 is a graph showing a noisy inputted signal $x_1(t)$ used in the simulation of the adaptive cross correlator apparatus shown in FIG. 1.
Figure 10:
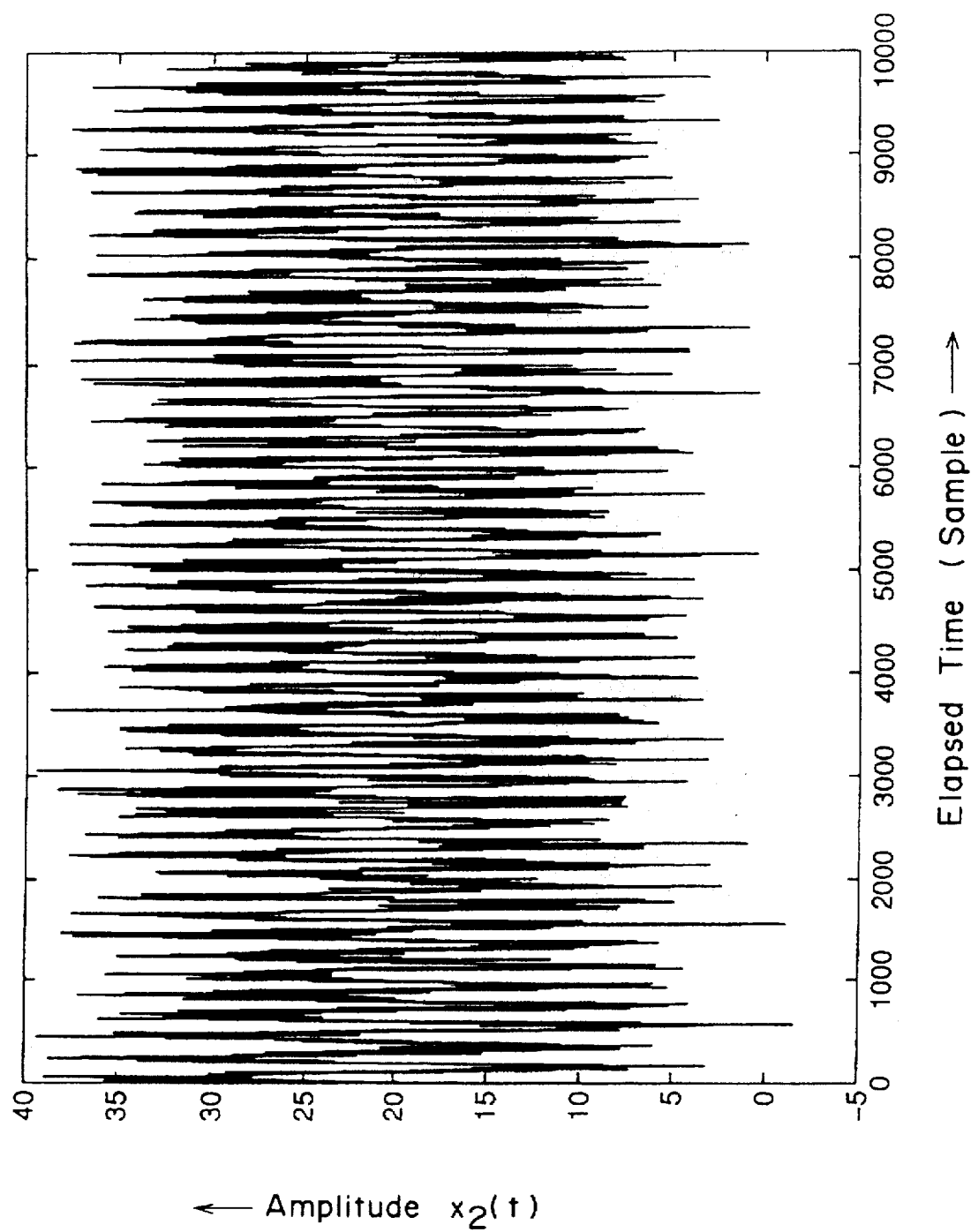
FIG. 10 is a graph showing a noisy inputted signal $x_2(t)$ used in the simulation of the adaptive cross correlator apparatus shown in FIG. 1.

Results of simulations using the adaptive cross correlator apparatus 100 of the present preferred embodiment will be described below. The following preliminary simulations were conducted to demonstrate the ability of the adaptive cross correlator apparatus 100 in order to extract a spectral characteristic of a clean signal from a noisy background. Normally we would expect to train the adaptive cross correlator apparatus 100 with an ensemble of noisy signals generated at various locations, however, here we use just a single noisy signal generated from a single location. Spectrums of a noise power and a noise-free clean signal power which are used for this simulation in a frequency range from 0 Hz to 5 kHz are shown in FIGS. 7 and 8, respectively. The noisy inputted signals $x_1(n)$ and $x_2(n)$ are defined, for example, as the following Equation (16):

$$x_1(n)=\text{noise }(n)+\text{signal }(n)\ \ x_2(n)=\text{noise}(n)+\text{signal}(n+4) \quad (16)$$

where n is a natural number and a number of accumulative sampling times (corresponding to elapsed time), which is ranged in $0 \leq n \leq 10000$, noise(n) is a non-Gaussian noise component in the n-th sample, and signal(n) is the signal component in the n-th sample. The above noisy inputted signals $x_1(n)$ and $x_2(n)$ are shown in FIGS. 9 and 10, respectively.

The only information provided to the adaptive cross correlator apparatus 100 of the present preferred embodiment is that the noise-free clean signal has a delay of four samples. It is noted that the noise was set so as to have a delay of zero in the present simulation, although it has not been mentioned in the present preferred embodiment. In the present simulation, the FIR filters 11 and 12 had transfer functions $H_1(\omega)$ and $H_2(\omega)$, respectively, and were chosen so that the two FIR filters 11 and 12 would be symmetric FIR filters having 21 coefficients. It is to be noted that both FIR filters 11 and 12 were initialized so as to be the same filters having identical filter coefficients. In addition, the present invention is not limited to this, and the two FIR filters 11 and 12 may also be asymmetric filters. After performing a small amount of simulation, the training factor $\eta$ was set to 0.00001 and the running cross correlation forgetting factor $\alpha$ was set to 1/500. The range of possible delays was restricted to between −10 and 10.

Figure 11:
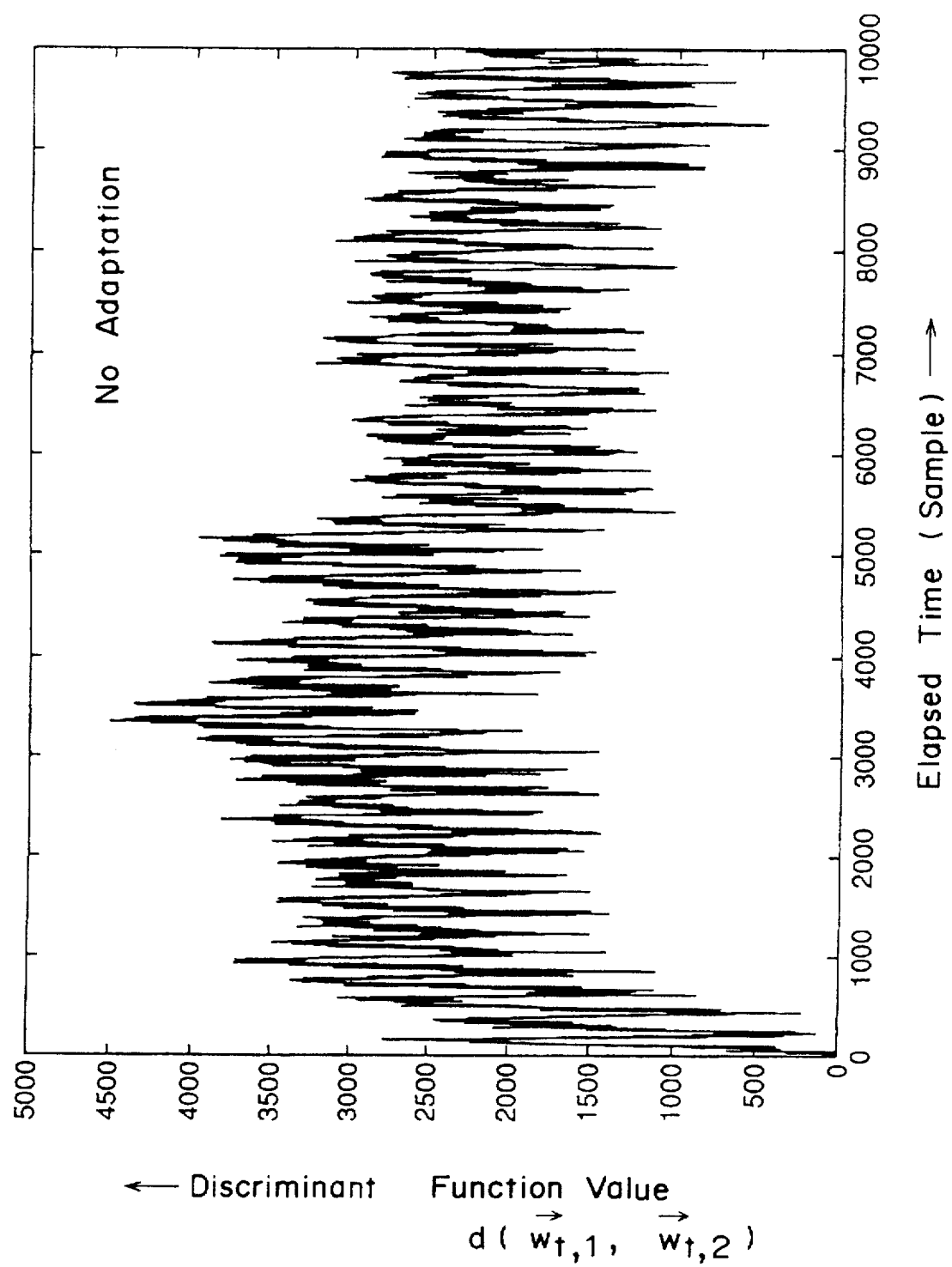
FIG. 11 is a graph showing a discriminant function value versus a number of accumulative sampling times (corresponding to elapsed time) when adaptation is allowed in the simulation of the adaptive cross correlator apparatus shown in FIG. 1.
Figure 13:
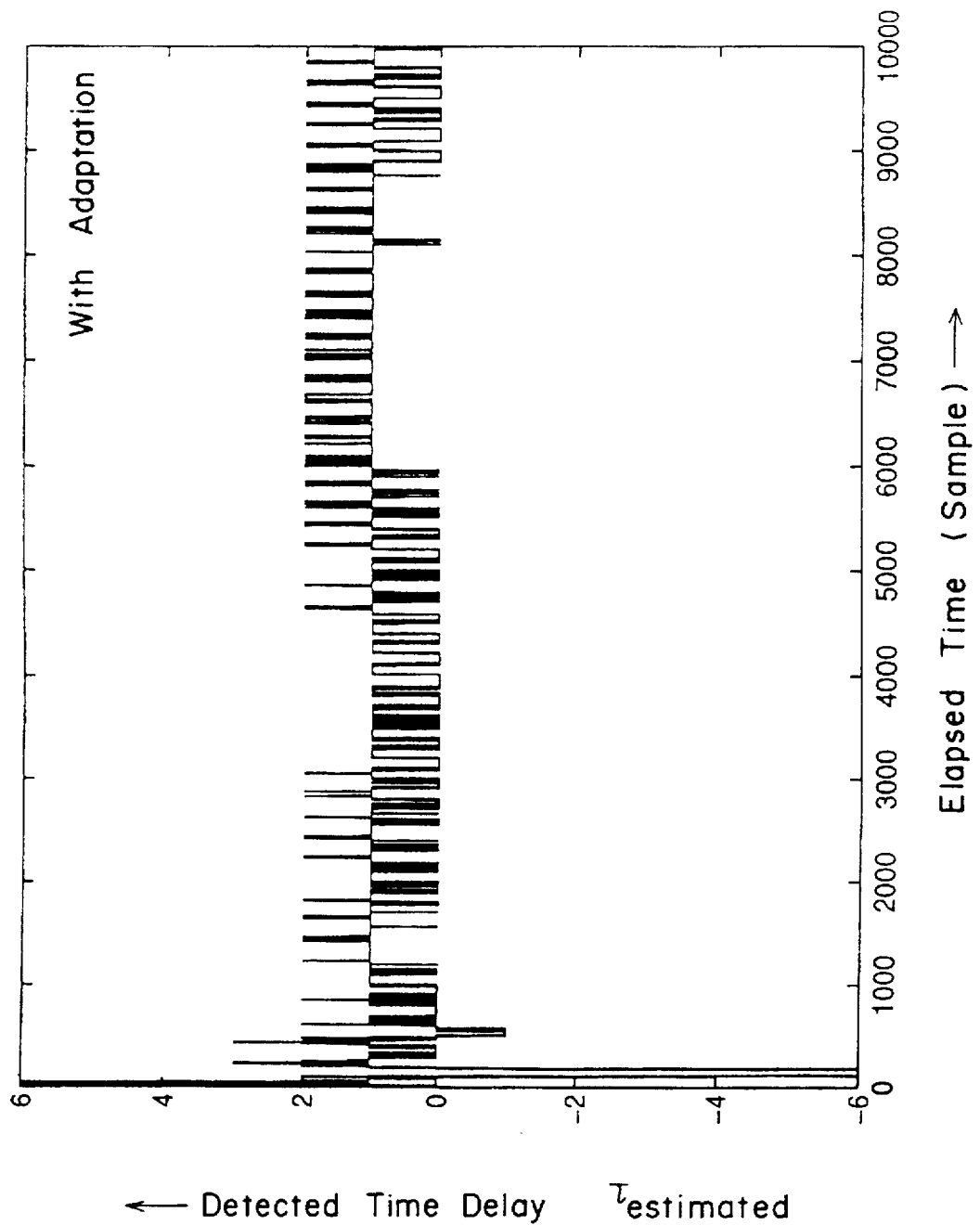
FIG. 13 is a graph showing a detected delay $\tau_{estimated}$ versus a number of accumulative sampling times (corresponding to elapsed time) when adaptation is allowed in the simulation of the adaptive cross correlator apparatus shown in FIG. 1.

Then, two simulations are performed. In the first simulation, no adaptation of the transfer functions $H_1(\omega)$ and $H_2(\omega)$ of the FIR filters 11 and 12 is allowed, and the delay is estimated over the signal duration. As can be seen in FIG. 13, the estimated delay is that of the noise, that is, is substantially equal to zero and not a delay of the signal. The reason thereof is that the noise energy is significantly larger than the signal energy. The value of the discriminant function $d(\vec{w}_{t,1}, \vec{w}_{t,2})$ and the value of the delay $\tau_{estimated}$ prior to the adaptation of the transfer functions $H_1(\omega)$ and $H_2(\omega)$ of the FIR filters 11 and 12 are shown in FIGS. 11 and 13, respectively. The second simulation is identical to the first simulation, except that the transfer functions $H_1(\omega)$ and $H_2(\omega)$ are not adapted.

Figure 12:
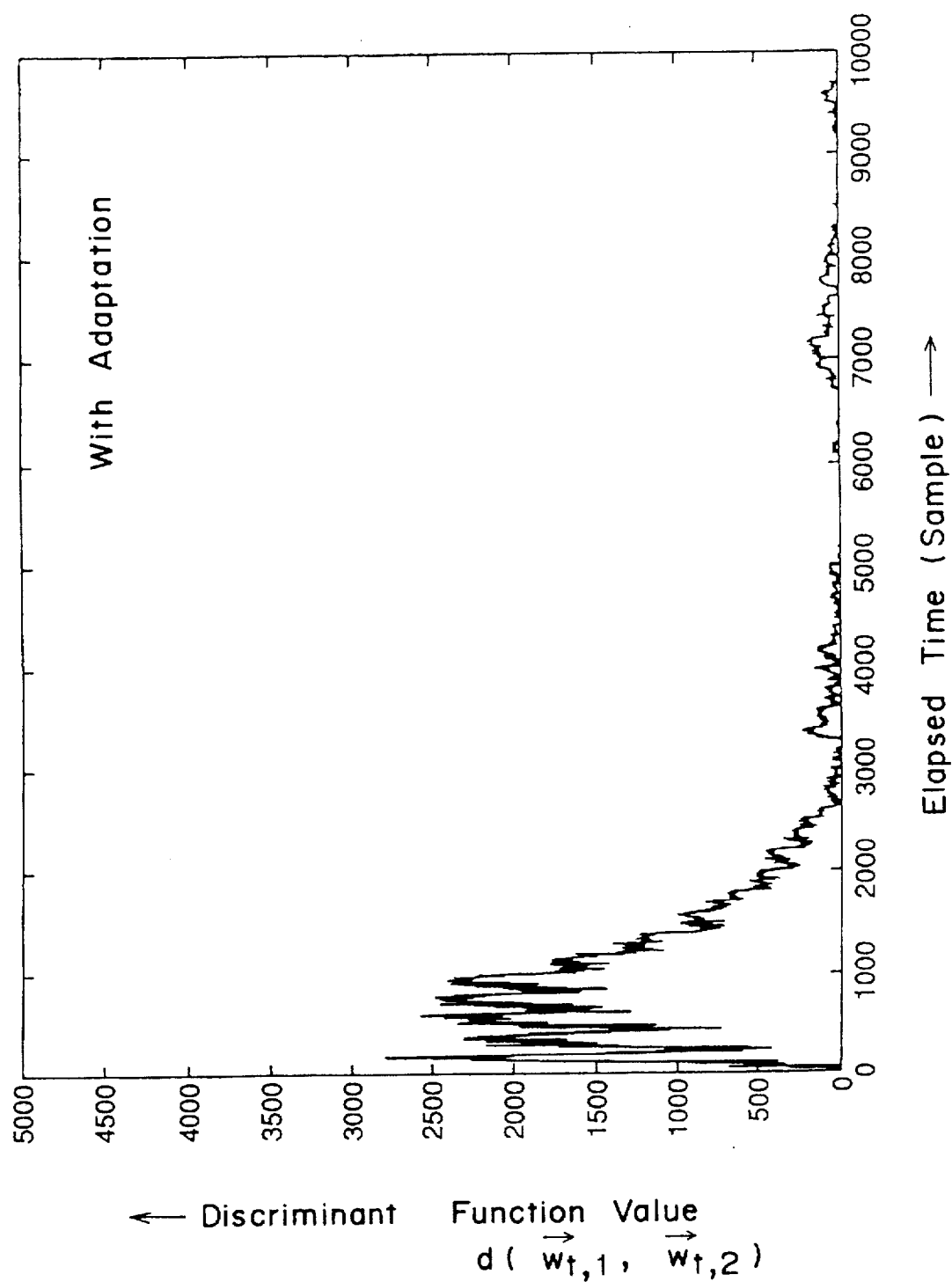
FIG. 12 is a graph showing a discriminant function value versus a number of accumulative sampling times (corresponding to elapsed time) when no adaptation is allowed in the simulation of the adaptive cross correlator apparatus shown in FIG. 1.
Figure 14:
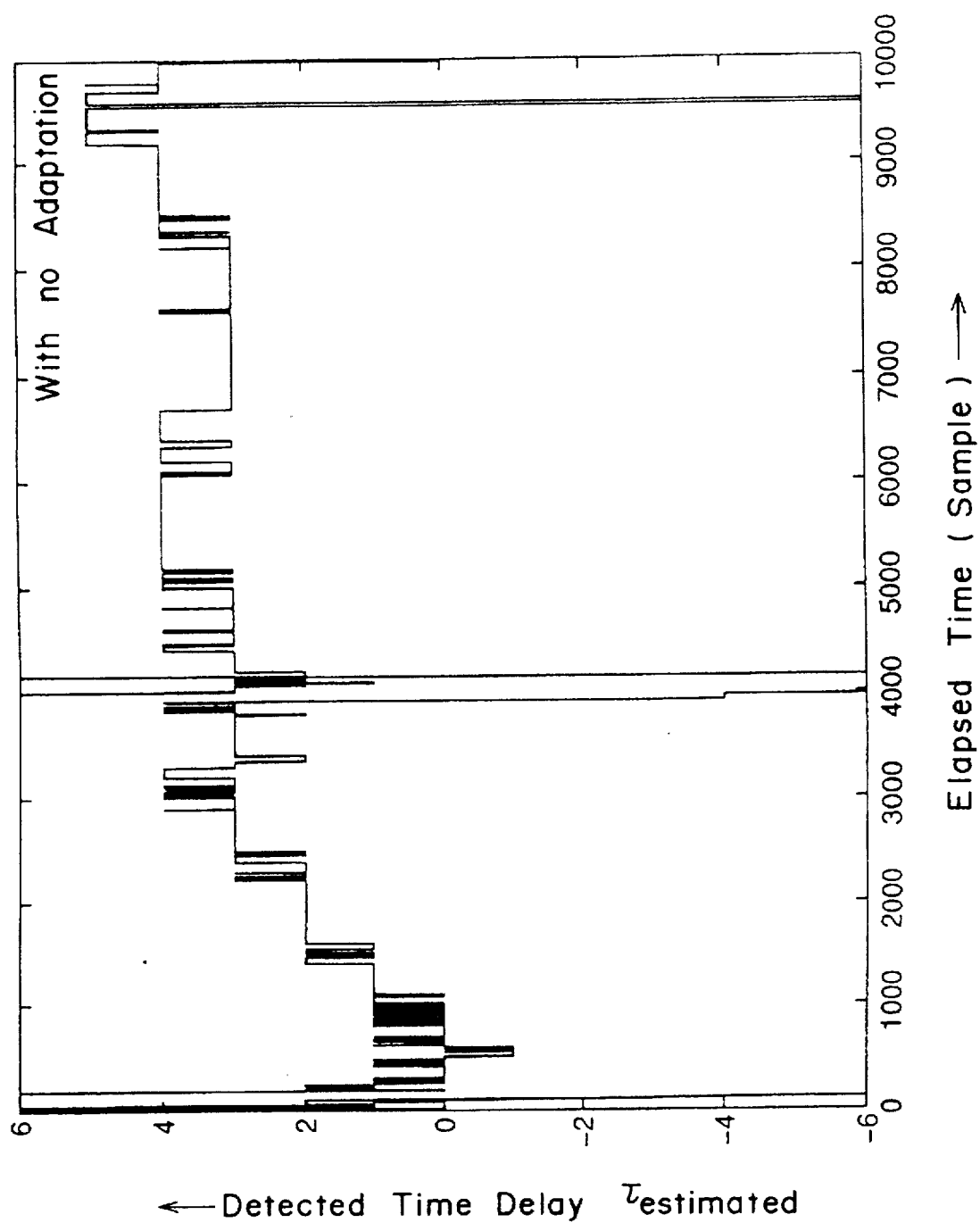
FIG. 14 is a graph showing a detected delay $\tau_{estimated}$ versus a number of accumulative sampling times (corresponding to elapsed time) when no adaptation is allowed in the simulation of the adaptive cross correlator apparatus shown in FIG. 1.

The delay $\tau_{estimated}$ and the discriminant function value $d(\vec{w}_{t,1}, \vec{w}_{t,2})$ detected as results of the adaptation are shown in FIGS. 12 and 14, respectively. As can be understood from these drawings, the transfer functions $H_1(\omega)$ and $H_2(\omega)$ after about 3000 samples have successfully adapted so as to cancel the majority of the noise, and the resulting delay estimates $\tau_{estimated}$ were close to the true signal delay, that is, approximate to 4. The transfer functions $H_1(\omega)$ and $H_2(\omega)$ after adaptation to the two FIR filters 11 and 12 were identical as expected, since the noise was the same in both inputted signals $x_1(t)$ and $x_2(t)$. However, under more general conditions that the noises differ between the inputted signals $x_1(t)$ and $x_2(t)$, the transfer functions $H_1(\omega)$ and $H_2(\omega)$ would then differ from each other.

Figure 15:
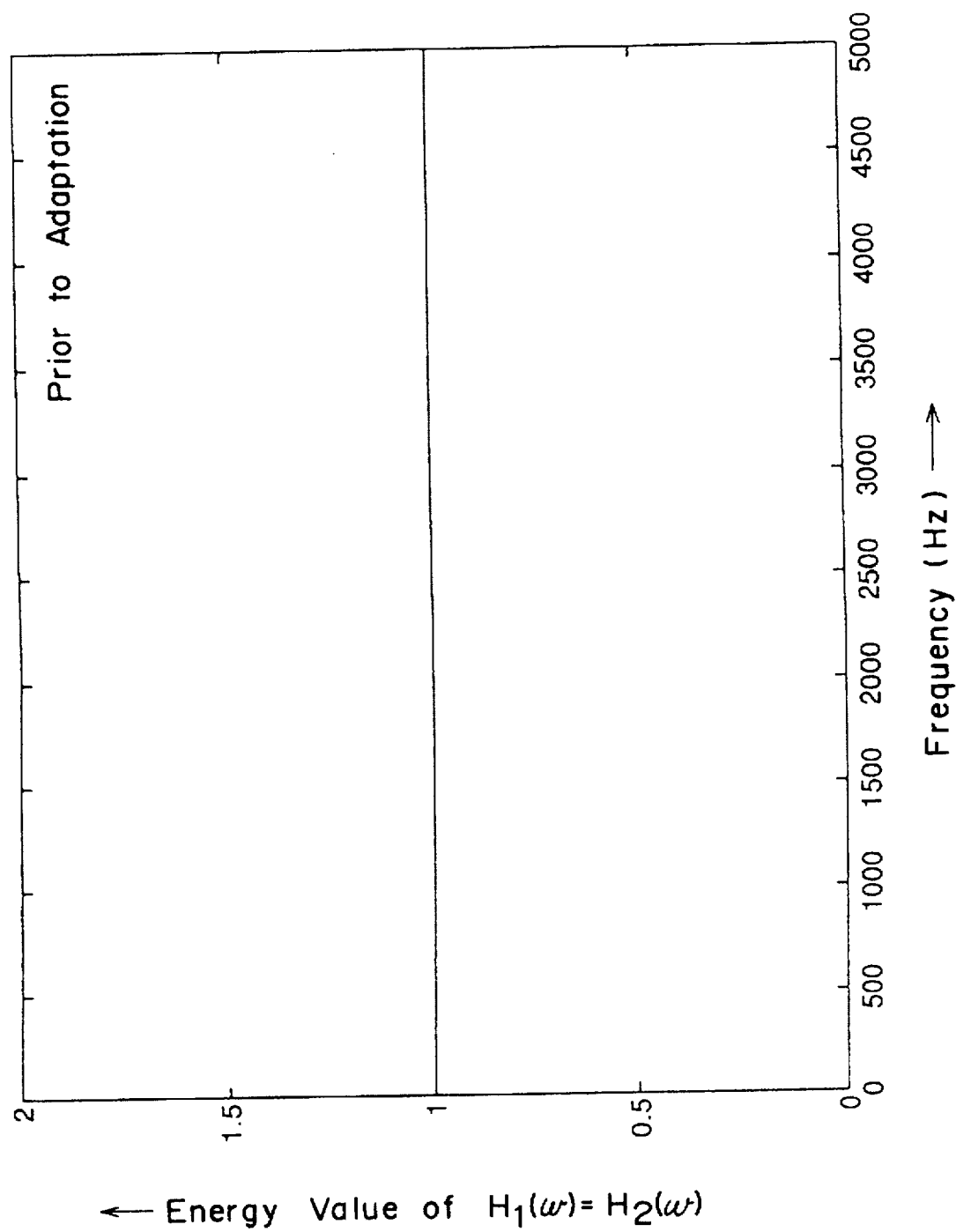
FIG. 15 is a graph showing a frequency characteristic of transfer functions $H_1(\omega)=H_2(\omega)$ of the FIR filters 11 and 12 shown in FIG. 1, prior to adaptation in the simulation of the adaptive cross correlator apparatus shown in FIG. 1.
Figure 16:
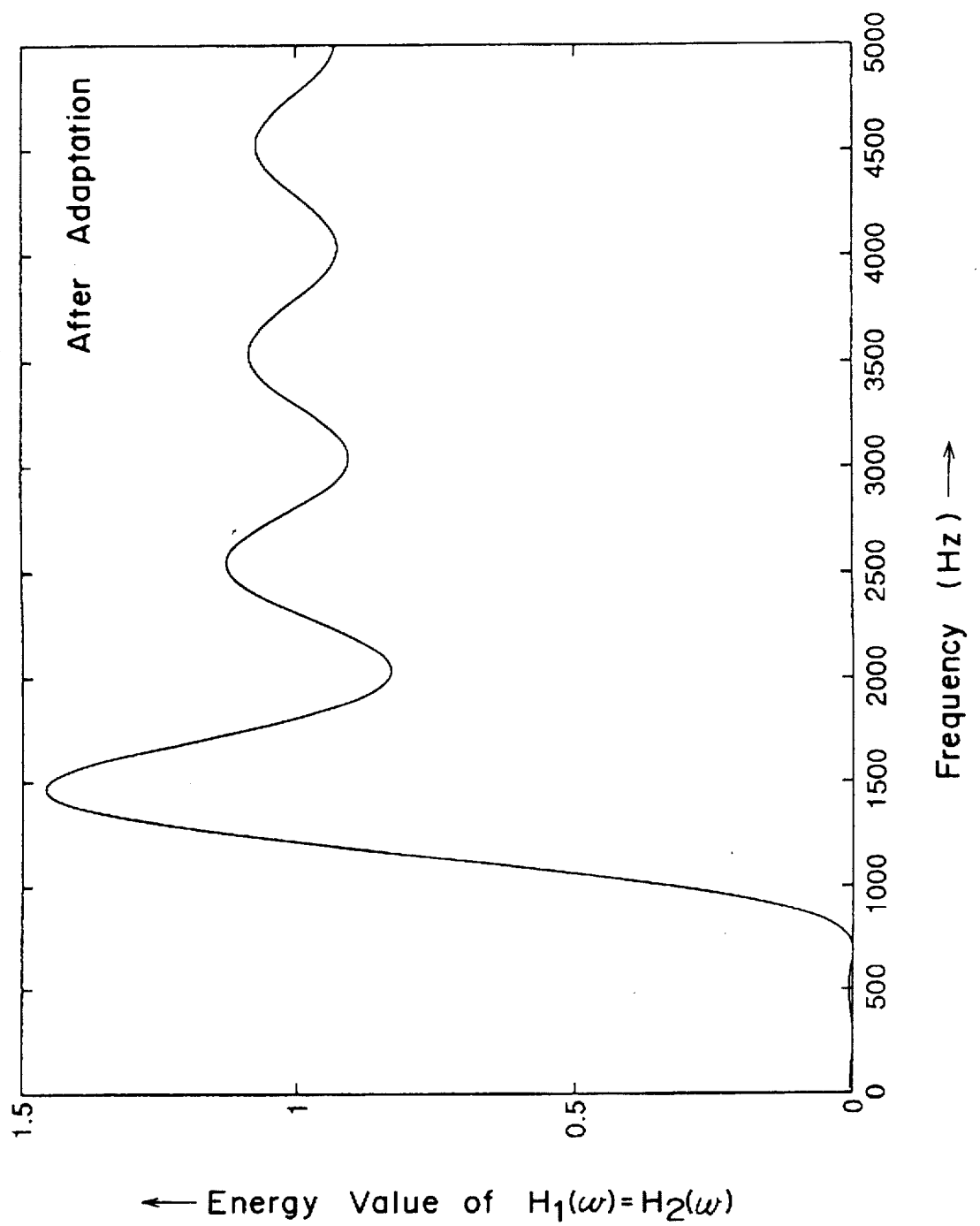
FIG. 16 is a graph showing a frequency characteristic of the transfer functions $H_1(\omega)=H_2(\omega)$ of the FIR filters 11 and 12 shown in FIG. 1, after adaptation in the simulation of the adaptive cross correlator apparatus shown in FIG. 1.
Figure 17:
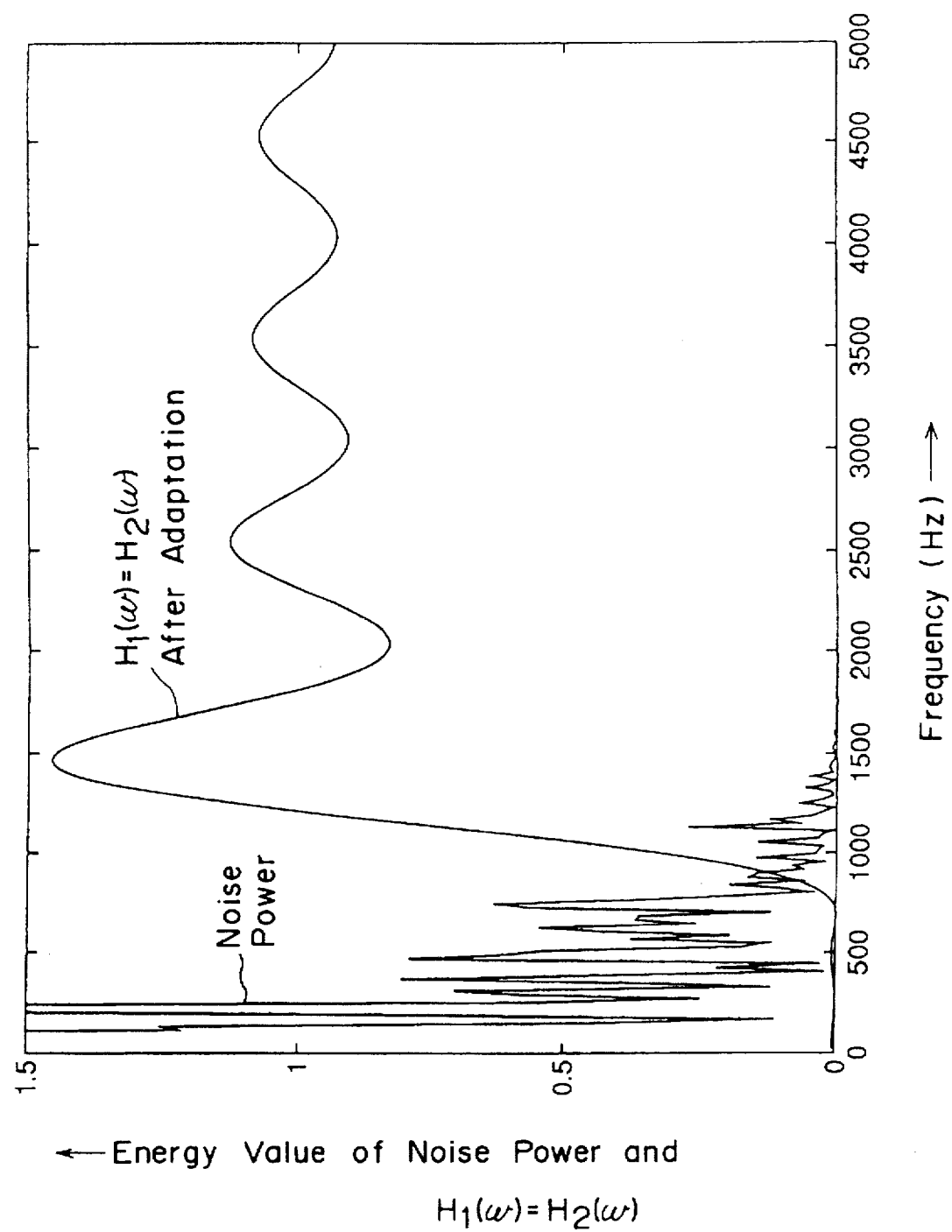
FIG. 17 is a graph in which a spectrum of noise power is overlaid on the frequency characteristics of the transfer functions $H_1(\omega)=H_2(\omega)$ of the FIR filters 11 and 12 shown in FIG. 1, after adaptation in the simulation of the adaptive cross correlator apparatus shown in FIG. 1.
Figure 18:
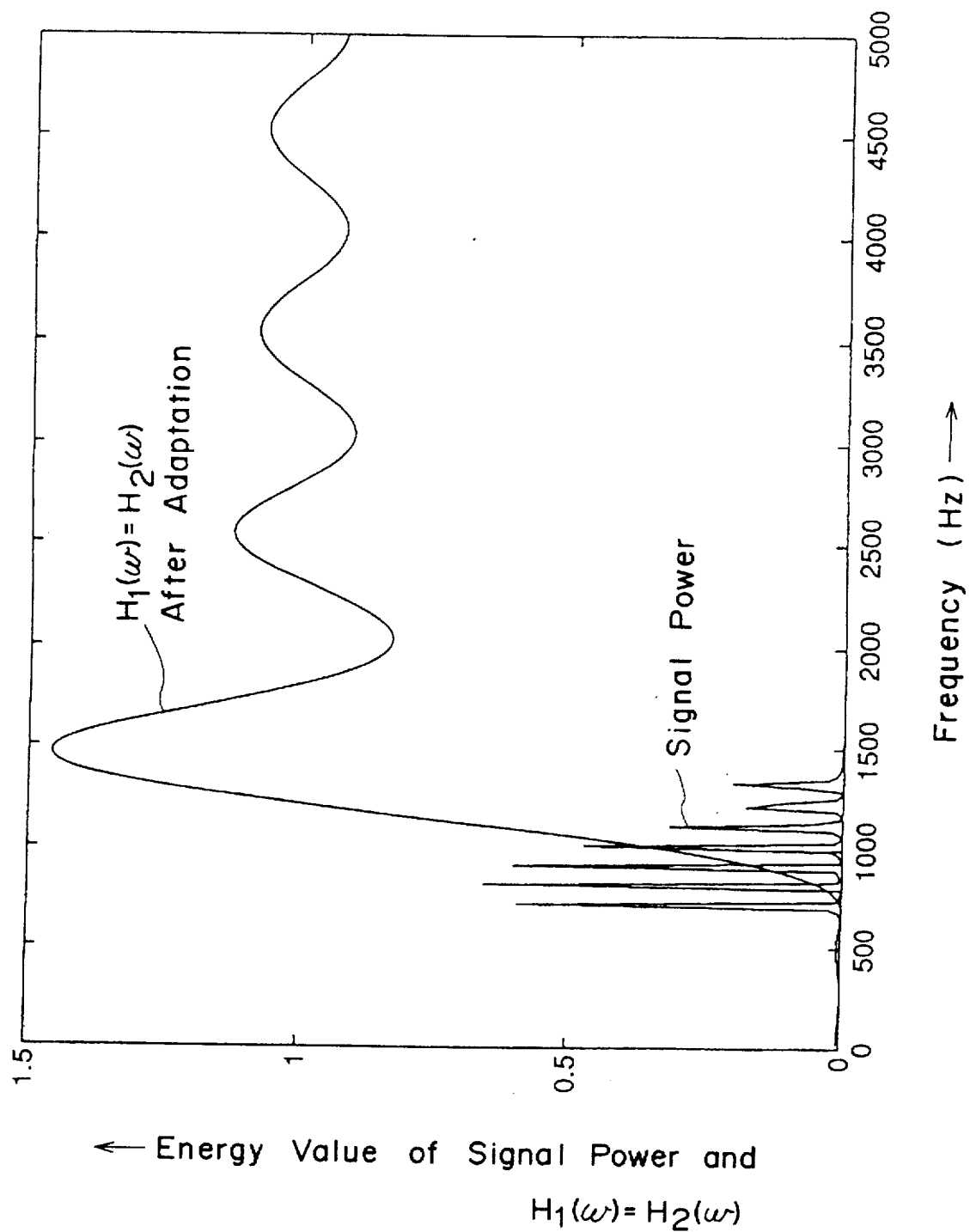
FIG. 18 is a graph in which a spectrum of noise-free clean signal power is overlaid on the frequency characteristics of the transfer functions $H_1(\omega)=H_2(\omega)$ of the FIR filters 11 and 12 shown in FIG. 1, after adaptation in the simulation of the adaptive cross correlator apparatus shown in FIG. 1.

The transfer functions $H_1(\omega)=H_2(\omega)$ before and after adaptation are shown in FIGS. 15 and 16, respectively. FIGS. 17 and 18 show the transfer functions $H_1(\omega)=H_2(\omega)$ after adaptation overlaid onto the spectrum of the signal and noise, respectively. The plots of these drawings clearly show that both FIR filters 11 and 12 have been adapted to attenuate the noisy part of the spectrum with successful results. In other words, the transfer functions $H_1(\omega)=H_2(\omega)$ after adaptation have been adapted in such a way that the noise power is removed but the signal power is passed.

It could be considered that these and several similarly successful preliminary simulations are sufficient to demonstrate the advantages of the method of the present invention.

As described above, we, inventors have invented a new type of adaptive filter based on the concept of minimizing a suitably defined discriminant function. Potential applications include time delay estimation as described above and speaker separation (the infamous cocktail party effect).

As described above, according to the preferred embodiment of the present invention, the respective transfer functions $H_1(\omega)$ and $H_2(\omega)$ of the FIR filters 11 and 12 are adaptively controlled or adjusted based on the discriminant function value outputted from the cross correlator 13 so that the discriminant function value representing the misclassification measure becomes a minimum. Therefore, the respective transfer functions $H_1(\omega)$ and $H_2(\omega)$ of the FIR filters 11 and 12 can be adaptively controlled or adjusted so that no errors will occur in detecting the time delay in non-Gaussian noise. Accordingly, it is possible to perform the estimation of time delay between two inputted signals as well as the speaker separation, with less errors compared with that of the prior art. Further, it is unnecessary to compute the signal-to-noise power ratio.

In the above-described preferred embodiment, coefficient changeable type FIR filters 11 and 12 have been used. However, the present invention is not limited to this, and there may be used other various filters having transfer functions which can be changed by an external circuit or apparatus.

According to the preferred embodiment of the present invention, the respective first and second transfer functions of the first and second filtering means can be adaptively controlled or adjusted more correctly in detecting and estimating the time delay in non-Gaussian noise with less errors compared with the prior art. Further, it is unnecessary to compute or calculate the signal-to-noise power ratio.

According to the preferred embodiment of the present invention, the delay between the first inputted signal and the second inputted signal with respect to one signal can be calculated more correctly even within a non-Gaussian noise with less errors compared with that of the prior art.

According to the preferred embodiment of the present invention, the first speech signal generated and outputted from the first sound source can be combined or synthesized in phase by the adding means, so that a signal in which the first speech signal generated and outputted from the first sound source is dominant can be obtained. Thus, the first speech signal generated and outputted from the first sound source can be separated from the second speech signal generated and outputted from the second sound source more correctly.

According to the present preferred embodiment of the present invention, the first transfer function of the first filtering means and the second transfer function of the second filtering means can be adaptively controlled or adjusted more simply as compared with that of the prior art.

According to the present preferred embodiment of the present invention, the first transfer function of the first filtering means and the second transfer function of the second filtering means can be adaptively controlled or adjusted more simply as compared with .that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An adaptive cross correlator apparatus comprising:
   first receiving means for receiving a signal and outputting the received signal as a first signal;
   second receiving means for receiving a further signal and outputting the received further signal as a second signal, said second receiving means provided at a position different from that of said first receiving means;
   first filtering means for filtering the first signal outputted from said first receiving means with a first changeable transfer function and outputting a filtered first signal;
   second filtering means for filtering the second signal outputted from said second receiving means with a second changeable transfer function and outputting a filtered second signal;
   cross correlator means for calculating a cross correlation value by using a predetermined cross correlation function based on the filtered first signal outputted from said first filtering means and the filtered second signal outputted from said second filtering means; and
   adaptive control means for calculating a discriminant function value representing a misclassification measure of the first and second signals, based on the cross correlation value outputted from said cross correlator means and a true delay between the first and second signals, and for adaptively adjusting the first transfer function of said first filtering means and the second transfer function of said second filtering means so that the calculated discriminant function value becomes a minimum.

2. The adaptive cross correlator apparatus as claimed in claim 1, further comprising:
   delay calculating means for calculating a delay between the first and second signals, based on the cross correlation value outputted from said cross correlator means, after a process of adaptive control performed by said adaptive control means.

3. The adaptive cross correlator apparatus as claimed in claim 2, said adaptive cross correlator apparatus provided for separating a first speech signal generated by a first sound source and a second speech signal generated by a second sound source, from each other, the first and second speech signals having spectral characteristics different from each other and being generated at locations different from each other, said adaptive cross correlator apparatus further comprising:
   delay means for delaying the filtered first signal outputted from said first filtering means, by a delay amount equal to a delay between said first and second receiving means which is calculated by said delay calculation means when the first speech signal generated by the first sound source is received by said first and second receiving means, and for outputting a delayed signal; and
   adding means for adding up the delayed signal outputted from said delay means and the filtered second signal outputted from said second filtering means, and for outputting a signal representing the addition result, thereby outputting an improved first speech signal.

4. The adaptive cross correlator apparatus as claimed in claim 1,
   wherein the discriminant function representing the misclassification measure of the first and second signals is a linearly differentiable function, and
   wherein said adaptive control means adaptively adjusts the first transfer function of said first filtering means and the second transfer function of said second filtering means by using a gradient descent method so that said calculated discriminant function value becomes a minimum.

5. The adaptive cross correlator apparatus as claimed in claim 2,
   wherein the discriminant function representing the misclassification measure of the first and second signals is a linearly differentiable function, and
   wherein said adaptive control means adaptively adjusts the first transfer function of said first filtering means and the second transfer function of said second filtering means by using a gradient descent method so that said calculated discriminant function value becomes a minimum.

6. The adaptive cross correlator apparatus as claimed in claim 3, wherein the discriminant function representing the misclassification measure of the first and second signals is a linearly differentiable function, and wherein said adaptive control means adaptively adjusts the first transfer function of said first filtering means and the second transfer function of said second filtering means by using a gradient descent method so that said calculated discriminant function value becomes a minimum.

7. The adaptive cross correlator apparatus as claimed in claim 1, wherein said first and second filtering means are finite impulse filters; and wherein said adaptive control means adaptively adjusts a filter coefficient of the finite impulse filter of said first filtering means and a filter coefficient of the finite impulse filter of said second filtering means so that said calculated discriminant function value becomes a minimum.

8. The adaptive cross correlator apparatus as claimed in claim 2, wherein said first and second filtering means are finite impulse filters; and wherein said adaptive control means adaptively adjusts a filter coefficient of the finite impulse filter of said first filtering means and a filter coefficient of the finite impulse filter of said second filtering means so that said calculated discriminant function value becomes a minimum.

9. The adaptive cross correlator apparatus as claimed in claim 3, wherein said first and second filtering means are finite impulse filters; and wherein said adaptive control means adaptively adjusts a filter coefficient of the finite impulse filter of said first filtering means and a filter coefficient of the finite impulse filter of said second filtering means so that said calculated discriminant function value becomes a minimum.

10. The adaptive cross correlator apparatus as claimed in claim 4, wherein said first and second filtering means are finite impulse filters; and wherein said adaptive control means adaptively adjusts a filter coefficient of the finite impulse filter of said first filtering means and a filter coefficient of the finite impulse filter of said second filtering means so that said calculated discriminant function value becomes a minimum.

* * * * *